US012796236B2

(12) United States Patent
Yang et al.

(10) Patent No.: US 12,796,236 B2
(45) Date of Patent: Nov. 10, 2026

(54) DISPLAY DEVICE AND METHOD OF FABRICATING THE SAME

(71) Applicant: Samsung Display Co., Ltd., Yongin-si (KR)

(72) Inventors: Yong Hoon Yang, Yongin-si (KR); Jin Lak Kim, Yongin-si (KR); Bo Geon Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 175 days.

(21) Appl. No.: 18/933,423

(22) Filed: Oct. 31, 2024

(65) Prior Publication Data

US 2025/0294966 A1 Sep. 18, 2025

(30) Foreign Application Priority Data

Mar. 12, 2024 (KR) ........................ 10-2024-0034611

(51) Int. Cl.

*H10K 59/122* (2023.01)
*H10K 59/12* (2023.01)
*H10K 59/126* (2023.01)
*H10K 59/38* (2023.01)

(52) U.S. Cl.

CPC ....... *H10K 59/122* (2023.02); *H10K 59/1201* (2023.02); *H10K 59/126* (2023.02); *H10K 59/38* (2023.02)

(58) Field of Classification Search

CPC .. H10K 59/122; H10K 59/1201; H10K 59/38; H10K 59/126

See application file for complete search history.

(56) References Cited

U.S. PATENT DOCUMENTS

| | | | | |
|---|---|---|---|---|
| 10,827,507 | B2 | 11/2020 | Agiwal et al. | |
| 11,388,726 | B2 | 7/2022 | Agiwal et al. | |
| 12,213,161 | B2 | 1/2025 | Agiwal et al. | |
| 2024/0224694 | A1* | 7/2024 | Lee | H10K 59/38 |
| 2024/0357908 | A1* | 10/2024 | Yang | H10K 59/1201 |
| 2025/0098433 | A1* | 3/2025 | Lazo Martinez | H10K 59/122 |

FOREIGN PATENT DOCUMENTS

| | | |
|---|---|---|
| KR | 10-2022-0017956 | 2/2022 |
| KR | 10-2024-0154145 | 10/2024 |

* cited by examiner

*Primary Examiner* — Mary Ellen Bowman

(74) *Attorney, Agent, or Firm* — CANTOR COLBURN LLP

(57) ABSTRACT

A display device includes a substrate, a first light-emitting element disposed on the substrate, a second light-emitting element disposed on the substrate and spaced apart from the first light-emitting element, a pixel-defining layer disposed on the substrate and at least partially bounding areas corresponding to the first light-emitting element and the second light-emitting element, a first wavelength conversion layer disposed on the first light-emitting element, a second wavelength conversion layer disposed on the second light-emitting element, a transparent bank pattern disposed on the pixel-defining layer, and a reflective layer disposed on each of a first lateral side surface of the transparent bank pattern, a bottom surfaces of the transparent bank pattern that faces the substrate, and a top surface of the first wavelength conversion layer that opposes the substrate. The transparent bank pattern is disposed between the first wavelength conversion layer and the second wavelength conversion layer.

21 Claims, 14 Drawing Sheets

DISPLAY DEVICE AND METHOD OF FABRICATING THE SAME

CROSS-REFERENCE TO RELATED APPLICATION(S)

This U.S. non-provisional patent application claims priority to and the benefits of Korean Patent Application No. 10-2024-0034611, under 35 U.S.C. § 119, filed in the Korean Intellectual Property Office on Mar. 12, 2024, the entire contents of which are hereby incorporated by reference.

BACKGROUND

1. Technical Field

The disclosure generally relates to a display device and a method of fabricating the same.

2. Description of the Related Art

The importance of display devices is gradually increasing along with the development of multimedia. In response, various display devices, such as liquid crystal display (LCD) devices, organic light-emitting diode (OLED) display devices, and others are being developed.

Among display devices, a self-emitting display device includes self-emitting elements, for example, organic light-emitting elements. The self-emitting elements may include two opposing electrodes, and a light-emitting layer interposed (or disposed) between the two electrodes. In a case of organic light-emitting elements, electrons and holes provided from the two electrodes may recombine in the light-emitting layer to generate excitons, and the generated excitons may emit light as the excitons transition from an excited state to a ground state.

A display device may include color conversion elements that receive light from organic light-emitting elements, etc., to implement or improve one or more colors. For example, the color conversion elements may receive blue light from organic light-emitting elements and may emit blue light, green light, and/or red light, thereby allowing images with various colors to be perceived. The color conversion elements may be disposed on a separate substrate in the display device or may be directly integrated with the elements in the display device.

The background provided herein is for the purpose of generally presenting the context of the disclosure. Work of the presently named inventors, to the extent that it is described in this background section, as well as aspects of the description that may not otherwise qualify as prior art at the time of filing, are neither expressly nor impliedly admitted as prior art against the disclosure.

SUMMARY

Aspects provide a display device with a relatively low reflectance of external light and increased visibility.

Additional aspects will be set forth in the detailed description, which follows, and in part, will be apparent from the disclosure, or may be learned by practice of the disclosed embodiments and/or the claimed subject matter.

According to an aspect, a display device includes a substrate, a first light-emitting element, a second light-emitting element, a pixel-defining layer, a first wavelength conversion layer, a second wavelength conversion layer, a first transparent bank pattern, and a reflective layer. The first light-emitting element is disposed on the substrate. The second light-emitting element is disposed on the substrate and spaced apart from the first light-emitting element. The pixel-defining layer is disposed on the substrate and at least partially bounds areas corresponding to the first light-emitting element and the second light-emitting element. The first wavelength conversion layer is disposed on the first light-emitting element. The second wavelength conversion layer is disposed on the second light-emitting element. The first transparent bank pattern is disposed on the pixel-defining layer. The first transparent bank pattern is disposed between the first wavelength conversion layer and the second wavelength conversion layer. The reflective layer is disposed on each of a first lateral side surface of the first transparent bank pattern, a bottom surface of the first transparent bank pattern that faces the substrate, and a top surface of the first wavelength conversion layer that opposes the substrate.

In an embodiment, the first lateral side surface of the first transparent bank pattern may face a corresponding first lateral side surface of the first wavelength conversion layer, and a second lateral side surface of the first transparent bank pattern may oppose the first lateral side surface of the first transparent bank pattern and may face a corresponding second lateral side surface of the second wavelength conversion layer.

In an embodiment, the second lateral side surface of the first transparent bank pattern may directly contact the corresponding second lateral side surface of the second wavelength conversion layer.

In an embodiment, the display device may further include a light-shielding layer disposed on the reflective layer.

In an embodiment, the light-shielding layer may overlap each of the first light-emitting element, the second light-emitting element, the first wavelength conversion layer, and the second wavelength conversion layer.

In an embodiment, a top surface of the light-shielding layer and a top surface of the first transparent bank pattern may be coplanar with one another.

In an embodiment, the display device may further include a second transparent bank pattern, a first color filter, and a second color filter. The second transparent bank pattern may be disposed on the pixel-defining layer and may be spaced apart from the first transparent bank pattern. The first wavelength conversion layer may be disposed between the second transparent bank pattern and the first transparent bank pattern. The first color filter may be disposed on the second transparent bank pattern and the first wavelength conversion layer. The second color filter may be disposed on each of the first transparent bank pattern, the first wavelength conversion layer, and the second wavelength conversion layer.

In an embodiment, the first light-emitting element may overlap both the first color filter and the second color filter.

In an embodiment, the first color filter may overlap an entire top surface of the first transparent bank pattern, and the second color filter may overlap an entire top surface of the second transparent bank pattern.

In an embodiment, the first transparent bank pattern may have, in a plane perpendicular to the substrate, a rectangular cross-sectional shape or a cross-sectional shape in which the first lateral side extends oblique to the substrate.

In an embodiment, the display device may further include a third light-emitting element disposed on the substrate and spaced apart from both the first light-emitting element and the second light-emitting element, and a light-transmitting layer disposed on the third light-emitting element.

In an embodiment, the first wavelength conversion layer may include a base resin and a first wavelength conversion shifter, the second wavelength conversion layer includes a base resin and a second wavelength conversion shifter different from the first wavelength conversion shifter, and the light-transmitting layer may include a base resin.

According to an aspect, a display device includes a light-emitting structure, a light-transmitting structure, and a color filter structure. The light-emitting structure includes a first light-emitting area, a second light-emitting area, and a non-light-emitting area around the first light-emitting area and the second light-emitting area in a view in a direction perpendicular to the light-emitting structure. The light-transmitting structure is disposed on the light-emitting structure and includes a first light-transmitting area, a second light-transmitting area, and a light-shielding area around the first light-transmitting area and the second light-transmitting area in the view. The color filter structure is disposed on the light-transmitting structure. The light-shielding area respectively overlaps the first light-emitting area and the second light-emitting area in the view. The first light-transmitting area and the second light-transmitting area overlap the non-light-emitting area in the view.

In an embodiment, the display device may be structured so that light emitted from the first light-emitting area may pass through the first light-transmitting area, and light emitted from the second light-emitting area may pass through the second light-transmitting area.

In an embodiment, the color filter structure may include a first color filter and a second color filter. The first color filter may respectively overlap the first light-transmitting area and a first portion of the non-light-emitting area in the view. The second color filter may respectively overlap the second light-transmitting area and a second portion of the non-light-emitting area.

In an embodiment, both the first color filter and the second color filter may overlap the first light-emitting area in the view.

In an embodiment, the light-transmitting structure may include transparent bank patterns, light-transmitting members, and a reflective layer. The transparent bank patterns may be disposed in the first light-transmitting area and the second light-transmitting area. The light-transmitting members may be disposed in spaces between the transparent bank patterns and that overlap the light-shielding area in the view. The reflective layer may be disposed on each of bottom surfaces of the transparent bank patterns that face the light-emitting structure, first lateral side surfaces of the transparent bank patterns, and top surfaces of the light-transmitting members that face away from the light-emitting structure.

In an embodiment, the transparent bank patterns may include second lateral side surfaces that are different from the first lateral side surfaces, and the second lateral side surfaces of the transparent bank patterns may directly contact corresponding light-transmitting members among the light-transmitting members.

According to an aspect, a method of fabricating a display device includes forming first portions of a reflective layer on a light-emitting structure that includes light-emitting elements; forming transparent bank patterns on the first portions of the reflective layer; and forming second portions of the reflective layer on first lateral side surfaces of the transparent bank patterns such that the second portions of the reflective layer are respectively connected to the first portions of the reflective layer.

In an embodiment, the method may further include forming light-transmitting members on the light-emitting structure and between respectively adjacent transparent bank patterns among the transparent bank patterns, and forming third portions of the reflective layer on the light-transmitting members such that the third portions of the reflective layer are respectively connected to the second portions of the reflective layer.

According to an aspect, an electronic device includes a display device, a first light-emitting element, a second light-emitting element, a pixel-defining layer, a first wavelength conversion layer, a second wavelength conversion layer, a first transparent bank pattern, and a reflective layer. The display device includes a substrate. The first light-emitting element is disposed on the substrate. The second light-emitting element is disposed on the substrate and spaced apart from the first light-emitting element. The pixel-defining layer is disposed on the substrate and at least partially bounds areas corresponding to the first light-emitting element and the second light-emitting element. The first wavelength conversion layer is disposed on the first light-emitting element. The second wavelength conversion layer is disposed on the second light-emitting element. The first transparent bank pattern is disposed on the pixel-defining layer. The first transparent bank pattern is disposed between the first wavelength conversion layer and the second wavelength conversion layer. The reflective layer is disposed on each of a first lateral side surface of the first transparent bank pattern, a bottom surface of the first transparent bank pattern that faces the substrate, and a top surface of the first wavelength conversion layer that opposes the substrate.

According to various embodiments, reflectance of external light from a display device can be lowered, and visibility can be improved.

The foregoing general description and the following detailed description are illustrative and explanatory and are intended to provide further explanation of the claimed subject matter.

BRIEF DESCRIPTION OF THE DRAWINGS

Various embodiments disclosed herein are illustrated by way of example, and not by way of limitation, in the figures of the accompanying drawings, in which like reference numerals and/or characters refer to similar elements.

DETAILED DESCRIPTION OF THE EMBODIMENTS

Figure 1:
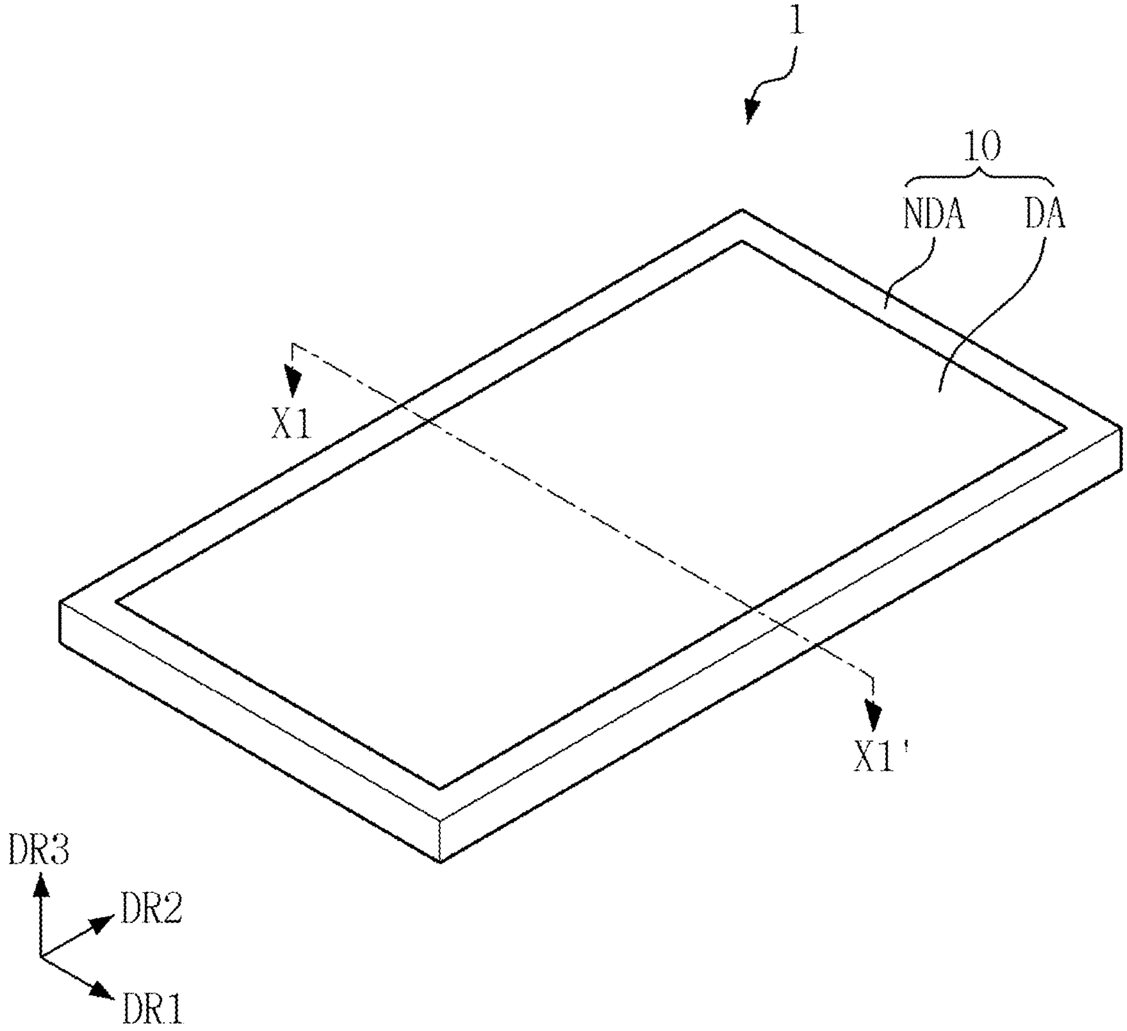
FIG. 1 is a perspective view schematically illustrating a display device according to an embodiment.

In the following description, for the purposes of explanation, numerous specific details are set forth to provide a thorough understanding of various embodiments or implementations. The terms "embodiments" and "implementations" may be used interchangeably to describe one or more non-limiting examples of systems, apparatuses, methods, etc., described herein. It is apparent, however, that various embodiments may be practiced without these specific details or with one or more equivalent arrangements. In other instances, known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the teachings of the disclosure.

Unless otherwise specified, the illustrated embodiments are to be understood as providing example features of varying detail of some embodiments. Thus, unless otherwise specified, the features, components, modules, layers, films, regions, aspects, structures, etc. (hereinafter individually or collectively referred to as an "element" or "elements"), of the various illustrations may be otherwise combined, separated, interchanged, and/or rearranged without departing from the teachings of the disclosure.

The use of cross-hatching and/or shading in the accompanying drawings is generally provided to clarify boundaries between adjacent elements. As such, neither the presence nor the absence of cross-hatching or shading is intended to convey or indicate any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. In a case that an embodiment may be implemented differently, a specific process order may be performed differently from the described order. For example, two consecutively described processes may be performed substantially at the same time or performed in an order opposite the described order. Also, like reference numerals and/or reference characters denote like elements.

In a case that an element, such as a layer, is referred to as being "on," "over," "connected to (or with)," or "coupled to (or with)" another element, it may be directly on, directly over, directly connected to (or with), or directly coupled to (or with) the other element or at least one intervening element may be present. However, in a case that an element is referred to as being "directly on," "directly over," "directly connected to (or with)," or "directly coupled to (or with)" another element, there are no intervening elements present. Other terms and/or phrases, if used herein, to describe a relationship between elements should be interpreted in a like fashion, such as "between" versus "directly between," "adjacent" versus "directly adjacent," "on" versus "directly on," "contacting" versus "directly contacting," "touching" versus "directly touching," etc. Further, the term "connected" may refer to physical, electrical, and/or fluid connection. To this end, for the purposes of this disclosure, the phrase "fluidically connected" may be used with respect to volumes, plenums, holes, openings, etc., that may be connected to one another, either directly or via one or more intervening components or volumes, to form a fluidic connection, similar to how the phrase "electrically connected" is used with respect to components that are connected to form an electric connection.

For the purposes of this disclosure, a first axis extending along a first direction DR1, a second axis extending along a second direction DR2, and a third axis extending along a third direction DR3 are not limited to three axes of a rectangular coordinate system, such as x, y, and z axes of a Cartesian coordinate system, and may be interpreted in a broader sense. For example, the first axis, the second axis, and the third axis may be perpendicular to one another, or may represent different directions that are not perpendicular to one another. Further, if used herein, the phrases "at least one of X, Y, . . . , and Z" and "at least one selected from the group consisting of X, Y, . . . , and Z" may be construed as X only, Y only, . . . , Z only, or any combination of two or more of X, Y, . . . , and Z, such as, for instance, XYZ, XYY, YZ, and ZZ. Also, if used herein, the term "and/or" includes any and all combinations of one or more of the associated listed items.

Although the terms "first," "second," "third," etc., may be used herein to describe various elements, these elements should not be limited by these terms. These terms are used to distinguish one element from another element. Thus, a first element discussed below could be termed a second element without departing from the teachings of the disclosure. To this end, use of such identifiers, e.g., "a first element," should not be read as suggesting, implicitly or inherently, that there is necessarily another instance, e.g., "a second element."

Spatially relative terms, such as "beneath," "below," "under," "lower," "above," "upper," "over," "higher," "side" (e.g., as in "sidewall"), and the like, may be used herein for descriptive purposes, and thereby, to describe one element's spatial relationship to at least one other element as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" or "over" the other elements or features. Thus, the term "below" can encompass both an orientation of above and below. Furthermore, the apparatus may be otherwise oriented (e.g., rotated 90 degrees or at other orientations), and as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. It is to be understood that the phrases "for each <item> of the one or more <items>," "each <item> of the one or more <items>," and/or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite dictionary definitions of "each" frequently defining the term to refer to "every one of two or more things") and would not imply that there must be at least two of those items. Similarly, the term "set" or "subset" should not be viewed, in and of itself, as necessarily encompassing a plurality of items—it is to be understood that a set or a subset can encompass only one member or multiple members (unless the context indicates otherwise).

The terms "comprises," "comprising," "includes," "including," "has," "have," and/or "having" when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," "approximately," and other similar terms, are used as terms of approximation and not as terms of degree, and as such, are utilized to account for inherent deviations in measured, calculated, and/or provided values that would be recognized by one of ordinary skill in the art. Accordingly, the terms "substantially," if used herein, and unless otherwise specified, may mean within 5% of a referenced value. For example, substantially perpendicular may mean within +5% of being parallel. The terms "about" and "approximately," if used herein, and unless otherwise specified, may mean within one or more standard deviations, or within +30%, +20%, +10%, or +5% of a stated value. Moreover, the term "between," if used herein in association with a range of values, is to be understood, unless otherwise indicated, as being inclusive of the start and end values of the range. For example, between 1 and 5 is to be understood as being inclusive of the numbers 1, 2, 3, 4, and 5, not just the numbers 2, 3, and 4. Furthermore, the expression "being the same" may mean "being substantially the same." For instance, the expression "being the same" may include a range that can be tolerated by those skilled in the art. Other expressions may also be expressions from which "substantially" has been omitted.

Various embodiments are described herein with reference to sectional views, isometric views, perspective views, orthographic views, and/or exploded illustrations that are schematic depictions of idealized embodiments and/or intermediate structures. As such, variations from the shapes of the illustrations because of, for example, manufacturing techniques and/or tolerances, are to be expected. Thus, embodiments disclosed herein should not be construed as limited to the illustrated shapes of regions, but are to include deviations in shapes that result from, for instance, manufacturing. To this end, regions illustrated in the drawings may be schematic in nature and shapes of these regions may not reflect the actual shapes of regions of a device, and as such, are not intended to be limiting.

As customary in the field, some embodiments may be described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and are not to be interpreted in an idealized or overly formal sense, unless expressly so defined herein.

Hereinafter, various embodiments will be described with reference to the accompanying drawings.

Figure 2:
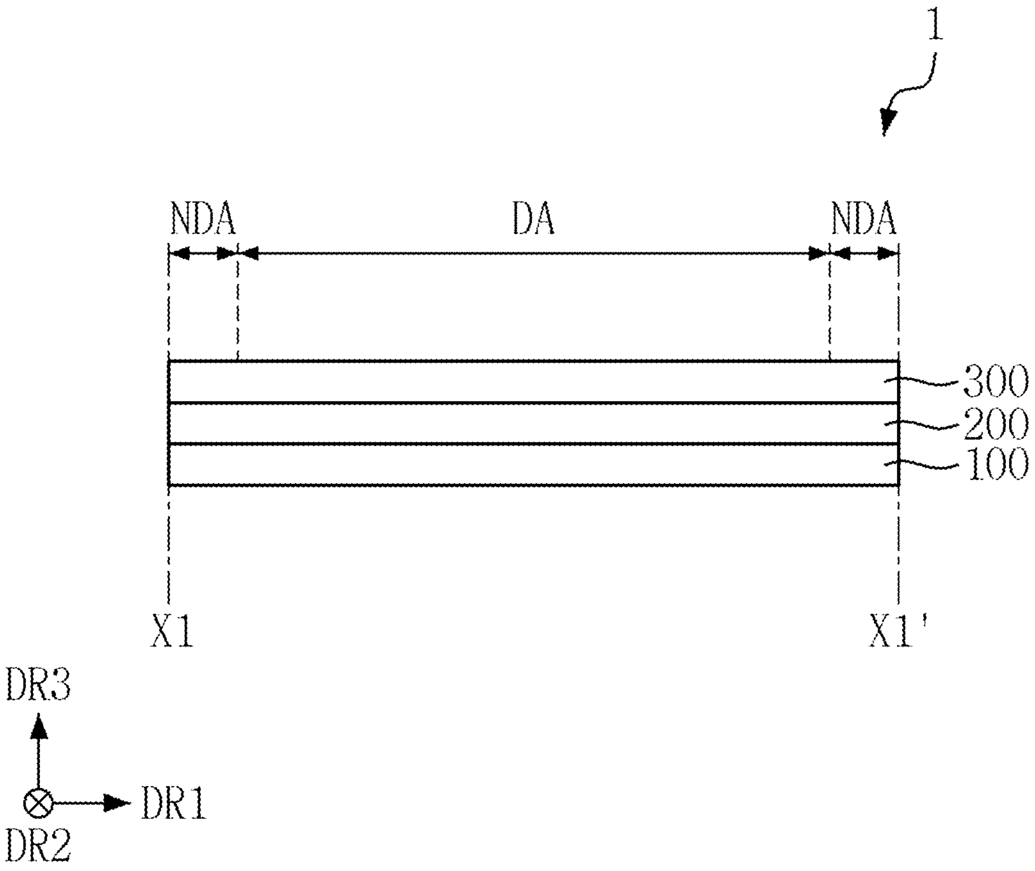
FIG. 2 is a schematic cross-sectional view taken along sectional line X1-X1' of FIG. 1 according to an embodiment.

FIG. 1 is a perspective view schematically illustrating a display device 1 according to an embodiment. FIG. 2 is a schematic cross-sectional view taken along line X1-X1' of FIG. 1 according to an embodiment.

Referring to FIGS. 1 and 2, a display device 1 may be applicable to (or used in association with) a portable electronic device, such as a mobile phone, a smartphone, a tablet personal computer (PC), a mobile communication terminal, an electronic notepad, an electronic-book reader, a portable multimedia player (PMP), a navigation system, an Ultra Mobile PC (UMPC), etc. In some embodiments, the display device 1 may be applied as a display part of a television (TV), a laptop, a monitor, an advertising display, or an Internet of Things (IoT) device. These electronic devices are merely examples, and various other electronic devices may be employed or used.

In FIG. 1, a first direction DR1, a second direction DR2, and a third direction DR3 are defined. The first and second directions DR1 and DR2 may be perpendicular to each other, the first and third directions DR1 and DR3 may be perpendicular to each other, and the second and third directions DR2 and DR3 may be perpendicular to each other. The first direction DR1 may represent a horizontal direction, the second direction DR2 may represent a vertical direction, and the third direction DR3 may represent a top-down direction, e.g., a thickness direction. In this specification, unless specifically mentioned, the term "direction" may refer to the positive and/or negative directions along a corresponding direction. For instance, referring to the first direction DR1 may be a reference to the positive direction as shown in FIG. 1, or the negative direction opposite the positive direction. Furthermore, if used to distinguish between two "directions" extending to opposing sides, one of the sides may be referred to as "one (or a) side" or "a first side," and another side may be referred to as "the other (or another) side" or "a second side." For example, referring to FIG. 1, the directions pointed to by arrows may each be referred to as pointing to one (or a) side or a first side, and the opposite directions may each be referred to as pointing to the other (or another) side or a second side. The third direction DR3 may also be referred to as the thickness direction.

For convenience, surfaces facing one (or a) side in the third direction DR3, which may be a direction in which images are displayed, may be referred to as top surfaces or front surfaces, and opposite surfaces may be referred to as bottom surfaces or back surfaces. Moreover, one (or a) side and the other (or another) side in the third direction DR3 may also be referred to as an upper side and a lower side, respectively.

The display device 1 may have a three-dimensional (3D) shape. For example, the display device 1 may have a planar shape that is similar to a rectangle in a view in the third direction DR3. In an embodiment, such as illustrated in FIG.

1, the display device 1 may have a planar shape that is similar to a rectangle having long sides in the second direction DR2 and short sides in the first direction DR1, but embodiments are not limited to this example planar shape. For example, the corners where the long sides in the second direction DR2 and the short sides in the first direction DR1 meet may be rounded (such as in a case of a rounded rectangular planar shape or an oblong planar shape) or right-angled. In some embodiments, the display device 1 may be formed in (or having) various other planar shapes, such as a non-tetragonal polygon, a circle, an ellipse, an oval, etc.

The display device 1 may include a display panel 10, a flexible circuit board, and a driver chip. The display panel 10 may include a display area DA where a screen (or image) is displayed and a non-display area NDA where the screen is not displayed. In an embodiment, the non-display area NDA may be disposed around (or circumscribe) the edges of the display area DA in a view in the third direction DR3, but embodiments are not limited to this example structure. As used herein, the term "circumscribe" is not limited to a first feature forming a circle around a second feature, and as such, may include the first feature forming any suitable two-dimensional geometric figure around the second feature in a view in, for instance, the third direction DR3. To this end, a first feature "surrounding" or "circumscribing" a second feature may (unless otherwise specified) include an inner boundary of the first feature touching one or more points of an outer boundary of the second feature, or the inner boundary of the first feature may be spaced apart from the outer boundary of the second feature. Moreover, a first feature "surrounding" a second feature may include (unless otherwise specified) the first feature completely or partially surrounding the second feature in a view in, for instance the third direction DR3. Based on FIG. 1, an image displayed in the display area DA may be viewed by a user from one (or a) side in the third direction DR3.

Referring to FIG. 2, the display panel 10 may include a light-emitting structure 100, a color filter structure 300, which may face the light-emitting structure 100 in the third direction DR3, and may include a light-transmitting structure 200, which may be disposed between the light-emitting structure 100 and the color filter structure 300. Although not illustrated, a filling unit and/or a sealing member may be further disposed between the light-transmitting structure 200 and the color filter structure 300.

The light-emitting structure 100 may include elements and circuits for displaying an image, such as pixel circuit elements (e.g., switching elements, capacitors, etc.), a pixel defining layer 170 (see FIG. 4), which defines (or at least partially bounds) light-emitting areas and a non-light-emitting area in the display area DA, and self-light-emitting elements. In an embodiment, the self-light-emitting elements may include organic light-emitting diodes (OLEDs), quantum dot light-emitting diodes (QLEDs), inorganic micro-light-emitting diodes (microLEDs), and/or inorganic nano-light-emitting diodes (nanoLEDs). For convenience, the self-light-emitting elements will, hereinafter, be described as OLEDs. A nanoLED may have a longitudinal dimension in a range of about 100 nm to about 10 μm, such as in a range of about 500 nm to about 5 μm. In some implementations, an aspect ratio of a nanoLED may be in a range of about 1 to about 100, such as in a range of about 1.2 to about 50, e.g., in a range of about 1.5 to about 20, for instance, in a range of about 1.5 to about 10. A microLED device may have one or more dimensions in a range of about 10 μm to about 100 μm, such as in a range of about 50 μm to about 100 μm.

The light-transmitting structure 200 may be positioned on the light-emitting structure 100. In one embodiment, the light-transmitting structure 200 may include a color conversion pattern that converts the color of incident light emitted from the light-emitting structure 100 and irradiated onto the light-transmitting structure 200. The light-transmitting structure 200 may include, as the color conversion pattern, light-transmitting members, transparent bank patterns surrounding or (circumscribing) the light-transmitting members in a view in the third direction DR3, and a reflective layer surrounding (or circumscribing) parts of the surfaces of the transparent bank patterns and parts of the surfaces of the light-transmitting members in a view in the third direction DR3. As will be described later, the light-transmitting members may include at least one of a wavelength conversion shifter and a light scatterer.

The color filter structure 300 may be positioned on the light-transmitting structure 200. In an embodiment, the color filter structure 300 may include first color filters, second color filters, and third color filters. Optionally, the color filter structure 300 may further include a black matrix.

Multiple light-emitting areas that may be defined in the light-emitting structure 100 of the display panel 10 and multiple light-transmitting areas that may be defined in the light-transmitting structure 200 will, hereinafter, be described.

Figure 3:
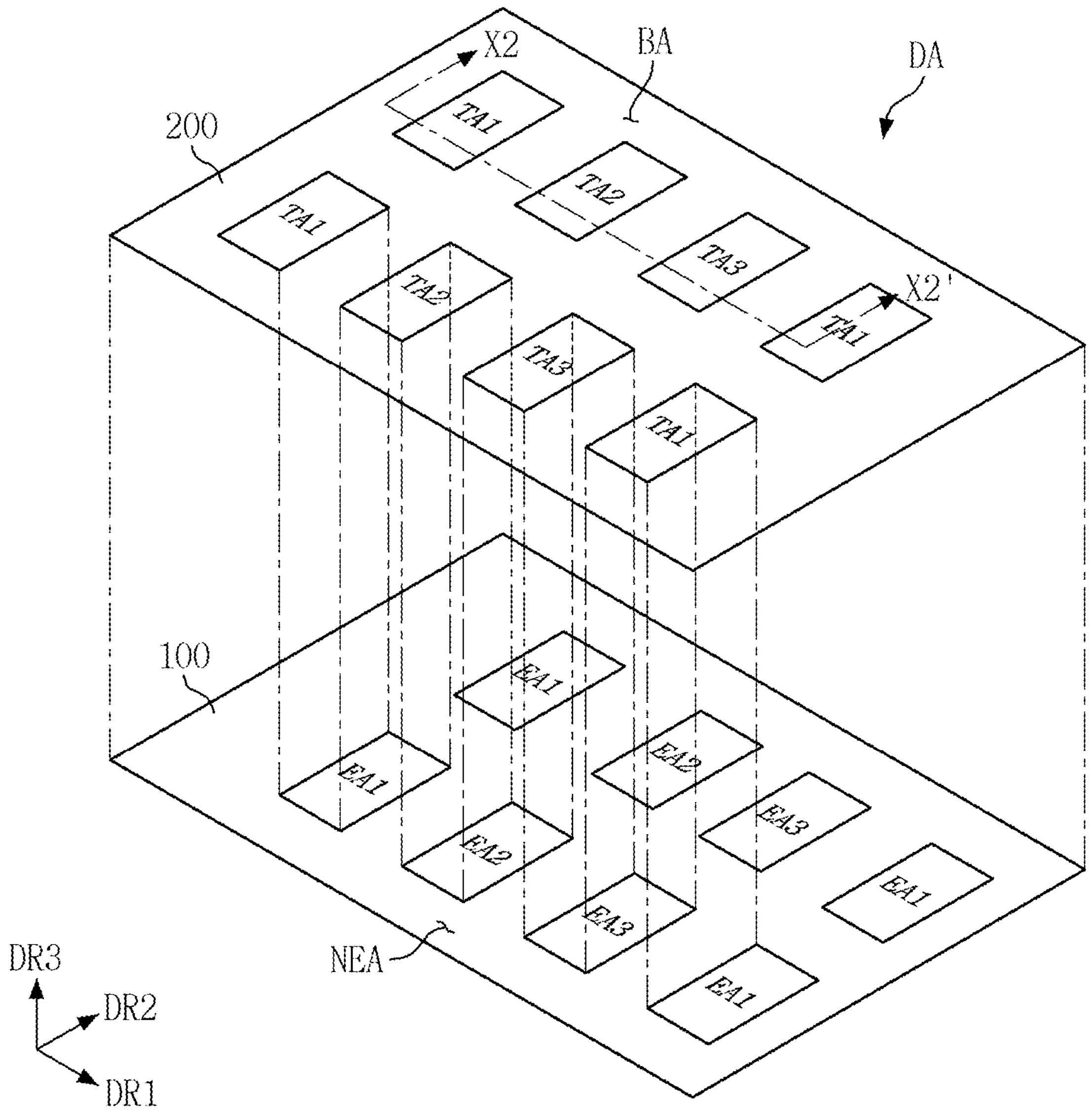
FIG. 3 is a perspective view schematically illustrating a light-emitting structure and a light-transmitting structure of the display device according to an embodiment.
Figure 4:
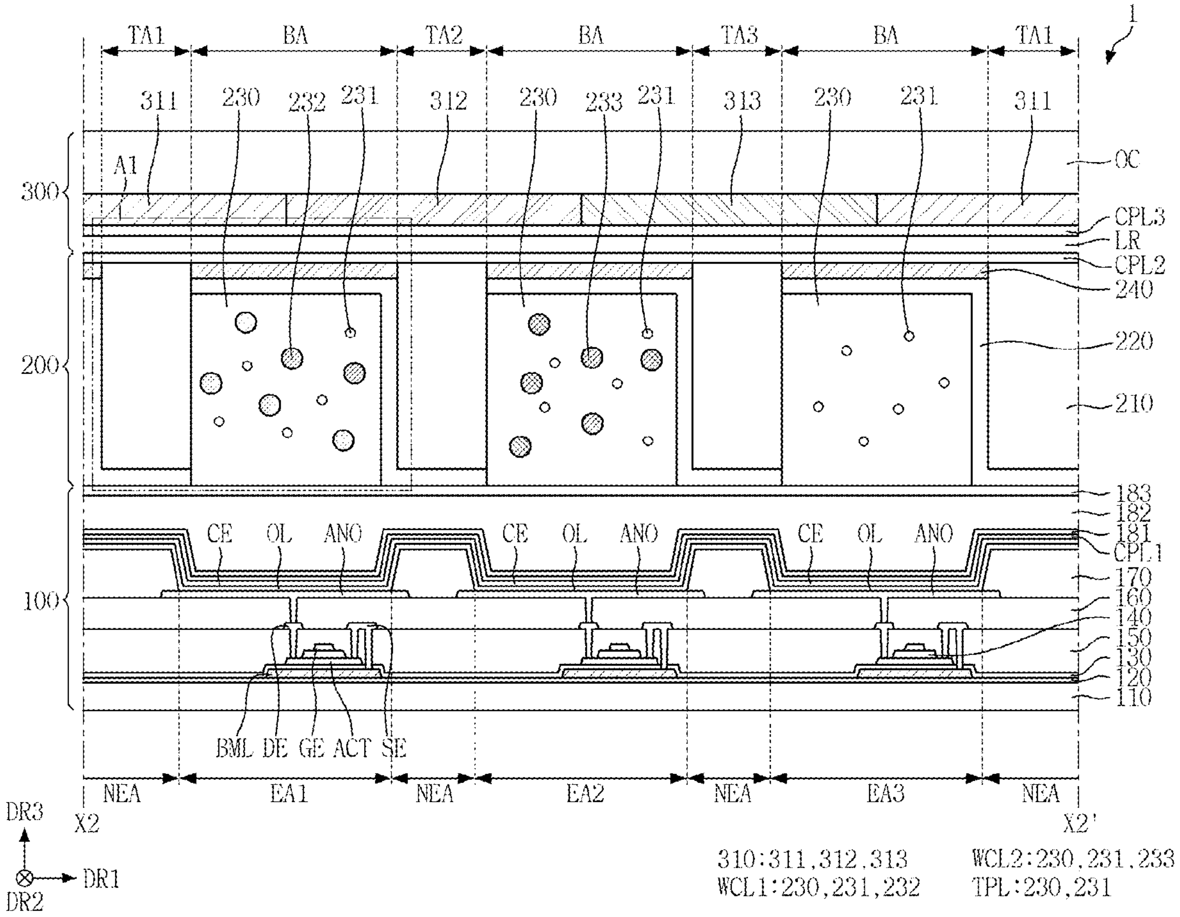
FIG. 4 is a schematic cross-sectional view taken along sectional line X2-X2' of FIG. 3 according to an embodiment.

FIG. 3 is a perspective view schematically illustrating the light-emitting structure 100 and the light-transmitting structure 200 in the display area DA of the display device 1 according to an embodiment. FIG. 4 is a schematic cross-sectional view taken along sectional line X2-X2' of FIG. 3 according to an embodiment.

Referring to FIGS. 3 and 4, multiple light-emitting areas (e.g., light-emitting areas EA1, EA2, and EA3) may be defined in the light-emitting structure 100 of the display device 1, and multiple light-transmitting areas (e.g., light-transmitting areas TA1, TA2, and TA3) may be defined in the light-transmitting structure 200 of the display device 1. Hereinafter, the light-emitting areas may be collectively referred to as light-emitting areas EA1, EA2, and EA3, and the light-transmitting areas may be collectively referred to as light-transmitting areas TA1, TA2, and TA3.

In the display area DA of the light-emitting structure 100, a first light-emitting area EA1, a second light-emitting area EA2, and a third light-emitting area EA3 may be defined. The first light-emitting area EA1, the second light-emitting area EA2, and the third light-emitting area EA3 may be areas where light generated by the light-emitting elements of the light-emitting structure 100 is emitted to the outside of the light-emitting structure 100, and a non-light-emitting area NEA may be an area where no light is emitted to the outside of the light-emitting structure 100. In an embodiment, the non-light-emitting area NEA may surround (or at least partially bound) the first light-emitting areas EA1, the second light-emitting areas EA2, and the third light-emitting areas EA3 in the display area DA in a view in the third direction DR3, but embodiments are not limited to this example. For example, the non-light-emitting area NEA may be positioned not only in the non-display area NDA, but may also be positioned in the display area DA of the light-emitting structure 100.

In an embodiment, the light emitted from the first light-emitting areas EA1, the second light-emitting areas EA2, and the third light-emitting areas EA3 to the outside may be a first-color light. In an embodiment, the first-color light may be blue light. In an embodiment, the first-color light may be mixed light obtained by mixing at least two of, for instance, blue light, green light, and red light. Red light may have a peak wavelength in a range of about 610 nm to about 650 nm, green light may have a peak wavelength in a range of about 510 nm to about 550 nm, and blue light may have a peak wavelength in a range of about 440 nm to about 480 nm. The term "peak wavelength" may refer to the wavelength of light at which the light has a maximum intensity.

In an embodiment, such as illustrated in FIGS. 3 and 4, the first light-emitting areas EA1, the second light-emitting areas EA2, and the third light-emitting areas EA3 may be sequentially arranged along the first direction DR1, forming groups, and each of the groups may consist of (or include) a first light-emitting area EA1, a second light-emitting area EA2, and a third light-emitting area EA3. The groups may be arranged one after another in the display area DA along the first and second directions DR1 and DR2, but embodiments are not limited to this example arrangement. The arrangement of the first light-emitting areas EA1, the second light-emitting areas EA2, and the third light-emitting areas EA3 may vary. In some implementations, the first light-emitting areas EA1, the second light-emitting areas EA2, and the third light-emitting areas EA3 may be sequentially arranged along the second direction DR2. For convenience, the first light-emitting areas EA1, the second light-emitting areas EA2, and the third light-emitting areas EA3 will, hereinafter, be described as arranged as illustrated in FIGS. 3 and 4.

In an embodiment, the areas and/or planar shapes of the first light-emitting areas EA1, the second light-emitting areas EA2, and the third light-emitting areas EA3 may be substantially equivalent, but embodiments are not limited to this example. For instance, at least one of the areas and/or planar shapes of the first light-emitting areas EA1, the second light-emitting areas EA2, and the third light-emitting areas EA3 may differ from at least another area among the first light-emitting areas EA1, the second light-emitting areas EA2, and the third light-emitting areas EA3. In an embodiment, the first light-emitting areas EA1, the second light-emitting areas EA2, and the third light-emitting areas EA3 may have a rectangular planar shape in a view in the third direction DR3, but embodiments are not limited to this example. For convenience, the first light-emitting areas EA1, the second light-emitting areas EA2, and the third light-emitting areas EA3 will, hereinafter, be described as having a rectangular planar shape in a view in the third direction DR3 and having substantially equivalent planar shapes as one another.

In the display area DA of the light-transmitting structure 200, first light-transmitting areas TA1, second light-transmitting areas TA2, and third light-transmitting areas TA3 may be defined. The first light-transmitting areas TA1, the second light-transmitting areas TA2, and the third light-transmitting areas TA3 may be areas that transmit light respectively generated from the first light-emitting areas EA1, the second light-emitting areas EA2, and the third light-emitting areas EA3 of the light-emitting structure 100. A light-shielding area BA may be positioned around the first light-transmitting areas TA1, the second light-transmitting areas TA2, and the third light-transmitting areas TA3 in the display area DA of the light-transmitting structure 200 in a view in the third direction DR3. In an embodiment, the light-shielding area BA may surround (or at least partially bound) the first light-transmitting areas TA1, the second light-transmitting areas TA2, and the third light-transmitting areas TA3 in a view in the third direction DR3, but embodiments are not limited to this example. The light-shielding area BA may be positioned not only in the display area DA, but may also be positioned in the non-display area NDA of the light-transmitting structure 200.

The first light-transmitting areas TA1 may be areas through which light output from the first light-emitting areas EA1 passes and may partially or not fully overlap with the first light-emitting areas EA1 in, for instance, the third direction DR3. The second light-transmitting areas TA2 may be areas through which light output from the second light-emitting areas EA2 passes and may partially or not fully overlap with the second light-emitting areas EA2 in, for instance, the third direction DR3. The third light-transmitting areas TA3 may be areas through which light output from the third light-emitting areas EA3 passes and may partially or not fully overlap with the third light-emitting areas EA3 in, for instance, the third direction DR3. In an embodiment, the entire first light-transmitting areas TA1 may completely not overlap with the first light-emitting areas EA1 in the third direction DR3, the entire second light-transmitting areas TA2 may completely not overlap the second light-emitting areas EA2 in the third direction DR3, and the entire third light-transmitting areas TA3 may completely not overlap the third light-emitting areas EA3 in the third direction DR3. However, embodiments not limited to this example. In some embodiments, parts of the first light-transmitting areas TA1 may or may not overlap the first light-emitting areas EA1 in, for instance, the third direction DR3, parts of the second light-transmitting areas TA2 may or may not overlap the second light-emitting areas EA2 in, for instance, the third direction DR3, and parts of the third light-transmitting areas TA3 may or may not overlap the third light-emitting areas EA3 in, for instance, the third direction DR3. For convenience, the first light-transmitting areas TA1, the second light-transmitting areas TA2, and the third light-transmitting areas TA3 will, hereinafter, be described as not overlapping at all with the first light-emitting areas EA1, the second light-emitting areas EA2, and the third light-emitting areas EA3, respectively in the third direction DR3.

The first light-transmitting areas TA1, the second light-transmitting areas TA2, and the third light-transmitting areas TA3 may be sequentially arranged along the first direction DR1, thereby forming pixel groups. Each of the pixel groups may consist of (or include) a first light-transmitting area TA1, a second light-transmitting area TA2, and a third light-transmitting area TA3. As illustrated in FIGS. 3 and 4, the pixel groups may be arranged one after another in the display area DA along the first and second directions DR1 and DR2.

As previously mentioned, the first-color light provided by the light-emitting structure 100 may be emitted to the outside of the display device 1, by passing through one or more of the first light-transmitting areas TA1, the second light-transmitting areas TA2, and the third light-transmitting areas TA3. The light emitted to the outside from the first light-transmitting areas TA1 will, hereinafter, be referred to as first emitted light, the light from the second light-transmitting areas TA2 as second emitted light, and the light from the third light-transmitting areas TA3 as third emitted light. The first emitted light may be third-color light, the second emitted light may be second-color light, and the third emitted light may be the first-color light. In an embodiment, the first-color light may be blue light, the second-color light may be green light, and the third-color light may be red light.

The structure of the display device 1 will, hereinafter, be described in further detail.

Referring to FIG. 4, the display device 1 may include the light-emitting structure 100, the light-transmitting structure 200, which may be disposed on the light-emitting structure 100, and the color filter structure 300, which may be disposed on the light-transmitting structure 200. For convenience, the display device 1 will, hereinafter, be described in the order of the light-emitting structure 100, the light-transmitting structure 200, and the color filter structure 300.

The light-emitting structure 100 may have a structure including a substrate 110, a buffer layer 120, bottom metal layers BML, a first insulating layer 130, semiconductor layers ACT, gate electrodes GE, gate insulating layers 140, a second insulating layer 150, source electrodes SE and drain electrodes DE, a third insulating layer 160, light-emitting elements, a pixel-defining layer 170, a first capping layer CPL1, and a thin-film encapsulation layer (181, 182, and 183) are stacked (e.g., sequentially stacked in the recited order) along one (or a) side in the third direction DR3. It is noted, however, that some of the aforementioned features may not perfectly adhere to the recited sequential ordering. For instance, portions of the light-emitting elements may be disposed under corresponding portions of the pixel-defining layer 170, and other portions of the light-emitting elements may be disposed adjacent to or even above the pixel-defining layer 170.

The substrate 110 of the light-emitting structure 100 may serve as a base (or base layer) for the light-emitting structure 100. The substrate 110 may be formed of a transparent material. The substrate 110 may be at least one of a glass substrate and a plastic substrate. In a case that the substrate 110 is a plastic substrate, the substrate 110 may be flexible. In an embodiment, the substrate 110 may be a plastic substrate, and the substrate 110 may include polyimide, but embodiments are not limited to this example.

The buffer layer 120 of the light-emitting structure 100 may be disposed on the substrate 110. The buffer layer 120 may be positioned between the substrate 110 and overlying devices, and may block foreign substances and/or moisture that may penetrate through the substrate 110.

In an embodiment, the buffer layer 120 may include an inorganic material, such as at least one of $SiO_2$, $SiN_x$, and $SiO_xN_y$, and may be formed as a single layer or a multilayer structure, but embodiments are not limited to the above-noted examples.

The bottom metal layers BML of the light-emitting structure 100 may be disposed on the buffer layer 120. The bottom metal layers BML may block external light or light emitted from the light-emitting elements from entering the semiconductor layers ACT. The bottom metal layers BML may prevent or reduce the occurrence of leakage current caused by light in thin-film transistors (TFTs) that will be described later.

The bottom metal layers BML may be formed of a material that can block light and has electrical conductivity. In an embodiment, the bottom metal layers BML may include a metal, such as at least one of silver (Ag), nickel (Ni), gold (Au), platinum (Pt), aluminum (Al), copper (Cu), molybdenum (Mo), titanium (Ti), and neodymium (Nd), and/or an alloy of any one of the aforementioned metal materials. The bottom metal layers BML may be formed as single layer or multilayer structures. For example, in a case that the bottom metal layers BML are formed as multilayers, the bottom metal layers BML may be formed as respective stack structures of, for instance, Ti/Cu/indium tin oxide (ITO) or Ti/Cu/aluminum oxide ($Al_2O_3$), but embodiments are not limited to these examples.

In an embodiment, multiple bottom metal layers BML may be provided to correspond to respective semiconductor layers ACT and may overlap the semiconductor layers ACT in, for example, the third direction DR3. The width of the bottom metal layers BML in one or more of the first and second directions DR1 and DR2 may be wider than corresponding widths of the semiconductor layers ACT.

The bottom metal layers BML may serve as parts of wirings that electrically connect data lines, power supply lines, and/or the TFTs (e.g., corresponding gate electrodes GE, semiconductor layers ACT, drain electrodes DE, and/or source electrodes SE of the TFTs) with one another. The bottom metal layers BML may be formed of a material with a lower electrical resistance than the source electrodes SE and/or the drain electrodes DE.

The first insulating layer 130 of the light-emitting structure 100 may be disposed on the bottom metal layers BML. The first insulating layer 130 may electrically insulate the bottom metal layers BML from the semiconductor layers ACT. The first insulating layer 130 may cover the bottom metal layers BML.

The first insulating layer 130 may include an inorganic material, such as at least one of $SiO_2$, $SiN_x$, $SiO_xN_y$, $Al_2O_3$, $TiO_2$, $Ta_2O_5$, $HfO_2$, and $ZrO_2$, but embodiments are not limited to these example materials.

The semiconductor layers ACT of the light-emitting structure 100 may be disposed on the first insulating layer 130. The semiconductor layers ACT may be disposed to correspond to (or with) the first light-emitting areas EA1, the second light-emitting areas EA2, and the third light-emitting areas EA3 in the display area DA of the light-emitting structure 100. The semiconductor layers ACT may overlap the bottom metal layers BML in, for instance, the third direction DR3, and may suppress photocurrent generation in the semiconductor layers ACT.

The semiconductor layers ACT may include an oxide semiconductor. For example, the semiconductor layers ACT may be formed of a zinc (Zn) oxide-based material, such as at least one of Zn oxide, indium-zinc oxide, and gallium-indium-zinc oxide, or may be an indium-gallium-zinc-oxide (IGZO) semiconductor containing metals, such as at least one of indium (In) and gallium (Ga) in ZnO, but embodiments are not limited to these examples. For instance, the semiconductor layers ACT may include amorphous silicon, polysilicon, or any other suitable semiconductor material.

The gate electrodes GE of the light-emitting structure 100 may be disposed on the semiconductor layers ACT. The gate electrodes GE may overlap the semiconductor layers ACT in, for instance, the third direction DR3 in the display area DA. The width of the gate electrodes GE in one or more of the first and second directions DR1 and DR2 may be narrower than corresponding widths of the semiconductor layers ACT, but embodiments are not limited to this example.

In an embodiment, the gate electrodes GE may include at least one of Al, Pt, palladium (Pd), Ag, magnesium (Mg), Au, Ni, Nd, iridium (Ir), chromium (Cr), lithium (Li), calcium (Ca), Mo, Ti, tungsten (W), and Cu. The material of the gate electrodes GE may be selected considering adhesion with adjacent layers, surface smoothness of the layers where the gate electrodes GE are stacked, and workability, but embodiments are not limited to the above-noted example materials.

The gate insulating layers 140 of the light-emitting structure 100 may be disposed between the semiconductor layers ACT and the gate electrodes GE. The gate insulating layers 140 may electrically insulate the semiconductor layers ACT from the gate electrodes GE. In an embodiment, the gate insulating layers 140 may be formed as a single unpatterned layer, or may be formed as partially patterned layers on one (or a) side, in the third direction DR3, of the substrate 110, and the respective widths of the gate insulating layers 140 in one or more of the first and second directions DR1 and DR2 may be narrower than corresponding widths of the semiconductor layers ACT. However, embodiments are not limited to these examples.

The gate insulating layers 140 may include an inorganic material. For example, the gate insulating layers 140 may include at least one of the inorganic material as exemplified in the description of the first insulating layer 130, but embodiments are not limited to the example materials described in association with the first insulating layer 130.

The second insulating layer 150 of the light-emitting structure 100 may be disposed on the gate insulating layers 140 and may cover (or overlap) both the semiconductor layers ACT and the gate electrodes GE in, for instance, the third direction DR3. In an embodiment, the second insulating layer 150 may function as a planarization film (or layer) that provides a flat (or substantially flat) surface overlapping a corresponding surface of the substrate 110 in the third direction DR3.

The second insulating layer 150 may include an organic material. In an embodiment, the second insulating layer 150 may include at least one of photo-acryl (PAC), polystyrene, polymethylmethacrylate (PMMA), polyacrylonitrile (PAN), polyamide, polyimide, polyarylether (PAE), a heterocyclic polymer, parylene, a fluoropolymer, an epoxy resin, a benzocyclobutene (BCB)-based resin, a siloxane-based resin, and a silane resin, but embodiments are not limited to these example materials.

The source electrodes SE and the drain electrodes DE of the light-emitting structure 100 may be disposed on the second insulating layer 150 and may be spaced apart from one another. The source electrodes SE and the drain electrodes DE may be electrically connected to the semiconductor layers ACT via contact holes that penetrate through the second insulating layer 150. In an embodiment, the source electrodes SE may also be electrically connected to the bottom metal layers BML via contact holes that not only penetrate through the second insulating layer 150, but may also penetrate through the first insulating layer 130. In a case that the bottom metal layers BML are parts of wirings that transmit signals and/or voltages, the source electrode SE may be electrically connected to the bottom metal layers BML to receive provided voltages and/or signals. In some embodiments, in a case that the bottom metal layers BML are electrically floating patterns, voltages provided to the source electrodes SE may be transmitted to the bottom metal layers BML, such as via capacitive coupling between the source electrodes SE and the bottom metal layers BML.

The source electrodes SE and the drain electrodes DE may include at least one of Al, Cu, Ti, and the like, and may be formed as multilayer or single layer structures. In an embodiment, the source electrodes SE and the drain electrodes DE may have a multilayer structure of Ti/Al/Ti, but embodiments are not limited to this example.

The respective semiconductor layers ACT, the gate electrodes GE, the source electrodes SE, and the drain electrodes DE may form corresponding TFTs that may be switching devices. In an embodiment, the TFTs may be positioned amongst the first light-emitting areas EA1, the second light-emitting areas EA2, and the third light-emitting areas EA3. In an embodiment, some of the TFTs may be fully or partially positioned in the non-light-emitting area NEA.

The third insulating layer 160 of the light-emitting structure 100 may be disposed on the second insulating layer 150 and may cover the TFTs. In an embodiment, the third insulating layer 160 may be a planarization film. For instance, the third insulating layer 160 may provide a flat (or substantially flat) surface overlapping a corresponding surface of the substrate 110 in the third direction DR3.

The third insulating layer 160 may be formed of an organic material. In an embodiment, the third insulating layer 160 may include at least one of an acrylic resin, an epoxy resin, an imide resin, and an ester resin, but embodiments are not limited to these example materials.

In the display area DA of the light-emitting structure 100, multiple anode electrodes ANO may be positioned on the third insulating layer 160. The anode electrodes ANO may be spaced apart from one another in one or more of the first and second directions DR1 and DR2.

The anode electrodes ANO may overlap the first light-emitting areas EA1, the second light-emitting areas EA2, and the third light-emitting areas EA3 in, for instance, the third direction DR3, and at least some of the anode electrodes ANO may extend even into the non-light-emitting area NEA. The anode electrodes ANO may be electrically connected to the drain electrodes DE of the TFTs.

In some embodiments, the anode electrodes ANO may be reflective electrodes, in which case, the anode electrodes ANO may include a metal layer formed of (or with) at least one of Ag, Mg, Al, Pt, Pd, Au, Ni, Nd, Ir, and Cr. In some embodiments, the anode electrodes ANO may further include a metal oxide layer stacked on the metal layer. For example, the anode electrodes ANO may have a multilayer structure, such as a double-layer structure of ITO/Ag, Ag/ITO, ITO/Mg, or ITO/MgF, or a triple-layer structure of ITO/Ag/ITO, but embodiments are not limited to the above-noted examples.

The pixel-defining layer 170 of the light-emitting structure 100 may be disposed on the anode electrodes ANO. The pixel-defining layer 170 may include apertures that expose portions of the anode electrodes ANO, and may define (or at least partially bound) the first light-emitting areas EA1, the second light-emitting areas EA2, and the third light-emitting areas EA3. The pixel-defining layer 170 may overlap the edges of the anode electrodes ANO in, for instance, the third direction DR3.

The pixel-defining layer 170 may overlap, in the third direction DR3, the light-transmitting areas TA1, TA2, and TA3 of a color filter layer 310. The pixel-defining layer 170 may overlap, in the third direction DR3, transparent bank patterns 210 that will be described later.

In an embodiment, the pixel-defining layer 170 may include an organic insulating material, such as at least one of a polyacrylates resin, an epoxy resin, a phenolic resin, a polyamide resin, a polyimide resin, an unsaturated polyester resin, a polyphenylene ether resin, a polyphenylene sulfide resin, and BCB, but embodiments are not limited to these example materials.

A light-emitting layer OL of the light-emitting structure 100 may be disposed on the anode electrodes ANO. In an embodiment, the light-emitting layer OL may have a continuous (or substantially continuous) film shape formed across the light-emitting areas EA1, EA2, and EA3 and the non-light-emitting area NEA. In an embodiment, the light-emitting layer OL may be positioned only in the display area DA, but embodiments are not limited to this example. In some implementations, part of the light-emitting layer OL may be disposed in the non-display area NDA.

The light-emitting layer OL may be an organic light-emitting layer formed of an organic material. The light-emitting layer OL may have a multilayer structure consisting of (or including) a hole injection material, a hole transport material, a light-emitting material, an electron transport material, and/or an electron injection material. In a case that a specific (or selected) voltage is applied to the anode electrodes ANO by the TFTs and a common or cathode voltage is received by a cathode electrode CE, holes and electrons may be injected and transported, and may combine in the light-emitting layer OL to emit light. In an embodiment, the emitted light may be blue light, but embodiments are not limited to this example. In some implementations, the emitted light may be yellow light or mixed light, such as white light. The light-emitting layer OL may have a structure including multiple light-emitting material layers stacked on one another, such as a tandem structure.

The cathode electrode CE of the light-emitting structure 100 may be disposed on the light-emitting layer OL. In an embodiment, the cathode electrode CE may be disposed on the light-emitting layer OL and may have a continuous (or substantially continuous) film shape formed across the light-emitting areas EA1, EA2, and EA3 and the non-light-emitting area NEA. For instance, the cathode electrode CE may fully (or substantially fully) cover (or overlap) the light-emitting layer OL in, for instance, the third direction DR3.

The cathode electrode CE may be semitransparent or transparent. In a case that the cathode electrode CE has a thickness of tens to hundreds of angstroms, the cathode electrode CE may be semitransparent. In an embodiment, the cathode electrode CE may be semitransparent, and the cathode electrode CE may include a metal, such as at least one of Ag, Mg, Cu, Al, Pt, Pd, Au, Ni, Nd, Ir, Cr, Li, and Ca, and/or a compound or mixture of at least two of the aforementioned materials (e.g., a mixture of Ag and Mg). In some embodiments, the cathode electrode CE may include a transparent conductive oxide to exhibit transparency. In an embodiment, the cathode electrode CE may be transparent, and the cathode electrode CE may include at least one of tungsten oxide ($W_xO_x$), titanium oxide ($TiO_2$), ITO, indium zinc oxide (IZO), zinc oxide (ZnO), indium tin zinc oxide (ITZO), magnesium oxide (MgO), and the like.

Combinations of the anode electrodes ANO, the light-emitting layer OL, and the cathode electrode CE may form light-emitting elements. For example, anode electrodes ANO that overlap the first light-emitting areas EA1 in the third direction DR3 may form first light-emitting elements together with the light-emitting layer OL and the cathode electrode CE, anode electrodes ANO that overlap the second light-emitting areas EA2 in the third direction DR3 may form second light-emitting elements together with the light-emitting layer OL and the cathode electrode CE, and anode electrodes ANO that overlap the third light-emitting areas EA3 in the third direction DR3 may form third light-emitting elements together with the light-emitting layer OL and the cathode electrode CE. The first light-emitting elements, the second light-emitting elements, and the third light-emitting elements may emit light.

A first capping layer CPL1 may be disposed on the cathode electrode CE. The first capping layer CPL1 may enhance viewing angle characteristics and increase external light emission efficiency. The first capping layer CPL1 may be commonly disposed over the first light-emitting areas EA1, the second light-emitting areas EA2, the third light-emitting areas EA3, and the non-light-emitting area NEA. The first capping layer CPL1 may fully (or substantially fully) cover the cathode electrode CE.

The first capping layer CPL1 may include at least one of a light-transmissive inorganic material and an organic material. For instance, the first capping layer CPL1 may be formed as an inorganic layer, an organic layer, and/or an organic layer containing inorganic particles. In an embodiment, the first capping layer CPL1 may include at least one of a triamine derivative, a carbazole derivative, an arylene diamine derivative, and an aluminum chelate compound ($Alq_3$), but embodiments are not limited to these example materials.

The thin-film encapsulation layer (which will be referred to as thin-film encapsulation layer 181, 182, and 183) of the light-emitting structure 100 may be disposed on the first capping layer CPL1. The thin-film encapsulation layer 181, 182, and 183 may protect underlying components from foreign substances, such as moisture. The thin-film encapsulation layer 181, 182, and 183 may be disposed over the first light-emitting areas EA1, the second light-emitting areas EA2, the third light-emitting areas EA3, and the non-light-emitting area NEA. The thin-film encapsulation layer 181, 182, and 183 may fully (or substantially fully) cover the first capping layer CPL1.

In some implementations, the thin-film encapsulation layer 181, 182, and 183 may include one or more inorganic encapsulation layers and one or more organic encapsulation layers that may be stacked in an alternating order on the first capping layer CPL1. For instance, the thin-film encapsulation layer 181, 182, and 183 may include a lower inorganic encapsulation layer 181, an organic encapsulation layer 182, and an upper inorganic encapsulation layer 183, which are sequentially stacked on the first capping layer CPL1 in the recited order.

The lower inorganic encapsulation layer 181 may fully (or substantially fully) cover (or overlap) the first capping layer CPL1 in the display area DA in the third direction DR3, and may cover (or overlap) the first light-emitting elements, the second light-emitting elements, and the third light-emitting elements in the third direction DR3. The organic encapsulation layer 182 may be disposed on the lower inorganic encapsulation layer 181 and may fully (or substantially fully) cover the lower inorganic encapsulation layer 181. The upper inorganic encapsulation layer 183 may be disposed on the organic encapsulation layer 182 and may fully (or substantially fully) cover the organic encapsulation layer 182.

The lower and upper inorganic encapsulation layers 181 and 183 may be formed of at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride ($SiO_xN_y$), and lithium fluoride, but embodiments are not limited to these example materials.

The organic encapsulation layer 182 may be formed of at least one of an acrylic resin, a methacrylate resin, polyisoprene, a vinyl resin, an epoxy resin, a urethane resin, a cellulose resin, and a perylene resin, but embodiments are not limited to these example materials.

The light-transmitting structure 200 will, hereinafter, be described with reference to FIG. 4.

The light-transmitting structure 200 may be disposed on the upper inorganic encapsulation layer 183, and may include light-transmitting members (e.g., first wavelength conversion layer WCL1, second wavelength conversion layer WCL2, and light-transmitting layer TPL), the transparent bank patterns 210, a reflective layer 220, a light-shielding layer 240, and a second capping layer CPL2. In an embodiment, the light-transmitting structure 200 may be formed after forming the light-emitting structure 100 on the substrate 110, but embodiments are not limited to this example. Hereinafter, the light-transmitting members may be collectively referred to as light-transmitting members WCL1, WCL2, and TPL.

The transparent bank patterns 210 may be disposed to form spaces for accommodating the light-transmitting members WCL1, WCL2, and TPL. Multiple spaces for accommodating the light-transmitting members WCL1, WCL2, and TPL may be provided and may be spaced apart from one another in, for instance, one or more of the first and second direction DR1 and DR2. For example, the transparent bank patterns 210 may partition (or at least partially bound) spaces where the light-transmitting members WCL1, WCL2, and TPL may be disposed. The transparent bank patterns 210 may surround (or circumscribe) the light-transmitting members WCL1, WCL2, and TPL in a view in, for instance, the third direction DR3.

The transparent bank patterns 210 may overlap the non-light-emitting area NEA in, for instance, the third direction DR3. The transparent bank patterns 210 may overlap the pixel-defining layer 170 of the light-emitting structure 100 in, for instance, the third direction DR3. The transparent bank patterns 210 may be disposed to partially overlap the light-emitting areas EA1, EA2, and EA3 in, for example, the third direction DR3, but embodiments are not limited to this example. For instance, the transparent bank patterns 210 may not overlap the light-emitting areas EA1, EA2, and EA3 in the third direction DR3.

The transparent bank patterns 210 may include a colorless, light-transmissive material that does not exhibit a color in the visible spectrum. The transparent bank patterns 210 may include a photocurable organic material. For example, the transparent bank patterns 210 may include a colorless, light-transmissive organic material, such as at least one of an acrylic resin, an acrylate resin, and an epoxy resin, but embodiments are not limited to these example materials.

The light-transmitting members WCL1, WCL2, and TPL of the light-transmitting structure 200 may be disposed on the upper inorganic encapsulation layer 183, exposed by the spaces formed by the transparent bank patterns 210. The light-transmitting members WCL1, WCL2, and TPL may include a first wavelength conversion layer WCL1, which may overlap the first light-emitting areas EA1 in the third direction DR3, a second wavelength conversion layer WCL2, which may overlap with the second light-emitting areas EA2 in the third direction DR3, and a light-transmitting layer TPL, which may overlap with the third light-emitting areas EA3 in the third direction DR3. The light-transmitting layer TPL, the first wavelength conversion layer WCL1, and the second wavelength conversion layer WCL2 may also be referred to as wavelength conversion layers or wavelength conversion material layers.

The first wavelength conversion layer WCL1 may be disposed in the spaces formed by the transparent bank patterns 210 and may overlap, in the third direction DR3, the first light-emitting areas EA1. At least parts of the first wavelength conversion layer WCL1 may not overlap the first light-transmitting areas TA1 in the third direction DR3.

The first wavelength conversion layer WCL1 may be a wavelength conversion pattern transforming or shifting the peak wavelength of incident light into light of a different peak wavelength. In an embodiment, the emitted light provided by the first light-emitting elements may be blue light and may be converted into red light with a peak wavelength in a range of about 610 nm to about 650 nm by passing through the first wavelength conversion layer WCL1.

The first wavelength conversion layer WCL1 may include a base resin 230, a light scatterer 231, which may be dispersed in the base resin 230, and a first wavelength shifter 232, which may also be dispersed in the base resin 230.

The base resin 230 may be formed of an organic material with relatively high light transmittance. In an embodiment, the base resin 230 may include an organic material, such as at least one of an epoxy resin, an acrylic resin, a silicone resin, a cardo resin, and an imide resin, but embodiments are not limited to these example materials.

The light scatterer 231 may have a different refractive index from the base resin 230, and may form an optical interface with the base resin 230. The light scatterer 231 may be light-scattering particles. The light scatterer 231 may scatter incident light in random directions, regardless of the direction of the incident light, without significantly altering the wavelength of light passing through the first wavelength conversion layer WCL1.

The light scatterer 231 may include particles of a metal oxide and/or an organic material, but these are just example materials. In an embodiment, the light scatterer 231 may include at least one of $TiO_2$, zirconium oxide ($ZrO_2$), $Al_2O_3$, indium oxide ($In_2O_3$), ZnO, and tin oxide ($SnO_2$) as the metal oxide, and may include at least one of an acrylic resin and a urethane resin as the organic material.

The first wavelength shifter 232 may convert or shift the peak wavelength of incident light into a different peak wavelength. The first wavelength shifter 232 may transform blue light provided by the first light-emitting elements into red light with a peak wavelength in a range of about 610 nm to about 650 nm.

In an embodiment, the first wavelength shifter 232 may include at least one of quantum dots, quantum rods, and phosphors, but embodiments are not limited to these examples. For convenience, the first wavelength shifter 232 will, hereinafter, be described as including quantum dots. The quantum dots are a particulate material that emits a specific (or selected) color as electrons transition from the conduction band to the valence band. The quantum dots may be a semiconductor nanocrystal material. The quantum dots may have a specific (or selected) bandgap depending on a composition and size of the quantum dots, and may absorb light and emitting light with a specific (or selected) wavelength. Examples of the semiconductor nanocrystal material may include at least one of a group IV compound nanocrystal material, a group II-VI compound nanocrystal material, a group III-V compound nanocrystal material, and a group IV-VI compound nanocrystal material, but any suitable semiconductor nanocrystal materials may be used as the quantum dots.

Light emitted by the first wavelength shifter 232 may have an emission spectrum full width at half maximum (FWHM) of about 45 nm or less, such as about 40 nm or less, e.g., about 30 nm or less, and may enhance the color purity and color reproduction of colors displayed by the display device 1. In some implementations, the light emitted by the first wavelength shifter 232 may be directed in multiple directions, regardless of the direction of incident light. The side visibility of the third-color light displayed in the first light-transmitting areas TA1 can be improved via use of the first wavelength shifter 232 and/or the light scatterer 231.

Some of the emitted light from the first light-emitting elements may pass through the first wavelength conversion layer WCL1 without being converted into red light by the first wavelength shifter 232. Components of the emitted light that are not wavelength-converted by the first wavelength conversion layer WCL1 may be blocked by first color filters 311. Conversely, the red light obtained by the first wavelength conversion layer WCL1 may be emitted to the outside by passing through the first color filters 311. The first emitted light emitted to the outside of the display device 1 through the first light-transmitting areas TA1 may be red light.

The second wavelength conversion layer WCL2 may be disposed in spaces formed by the transparent bank patterns 210, and may overlap the second light-emitting areas EA2 in the third direction DR3. At least parts of the second wavelength conversion layer WCL2 may not overlap the second light-transmitting areas TA2 in the third direction DR3.

The second wavelength conversion layer WCL2 may be a wavelength conversion pattern that converts or shifts the peak wavelength of incident light into light of a different peak wavelength. In an embodiment, the emitted light from the second light-emitting elements may be blue light, and may be converted into green light with a peak wavelength in a range of about 510 nm to about 550 nm by passing through the second wavelength conversion layer WCL2.

The second wavelength conversion layer WCL2 may include a base resin 230, a light scatterer 231, which may be dispersed in the base resin 230, and a second wavelength shifter 233, which may also be dispersed in the base resin 230.

The second wavelength shifter 233 may convert or shift the peak wavelength of incident light into a different peak wavelength. The second wavelength shifter 233 may transform blue light provided by the second light-emitting elements into green light with a peak wavelength in a range of about 510 nm to about 550 nm. In an embodiment, the second wavelength shifter 233 may include at least one of quantum dots, quantum rods, and phosphors, but embodiments are not limited to these examples. In a case that the second wavelength shifter 233 includes quantum dots, the second wavelength shifter 233 may have substantially a same configuration as the first wavelength shifter 232, which may also include quantum dots, and thus, a further description of the second wavelength shifter 233 will be omitted.

Some of the emitted light from the third light-emitting elements may pass through the second wavelength conversion layer WCL2 without being converted into green light by the second wavelength shifter 233. Components of the emitted light that are not wavelength-converted by the second wavelength conversion layer WCL2 may be blocked by second color filters 312. Conversely, the green light obtained by the second wavelength conversion layer WCL2 may be emitted to the outside by passing through the second color filters 312. The second emitted light emitted to the outside of the display device 1 through the second light-transmitting areas TA2 may be green light.

The light-transmitting layer TPL may be disposed in the spaces formed by the transparent bank patterns 210 and may overlap, in the third direction DR3, the third light-emitting areas EA3. At least parts of the light-transmitting layer TPL may not overlap the third light-transmitting areas TA3 in the third direction DR3.

The light-transmitting layer TPL may be a light-transmitting pattern allowing incident light to pass through. In an embodiment, the emitted light from the third light-emitting elements may be blue light and may be emitted to the outside of the display device 1 by passing through the third color filters 313. For example, the third emitted light emitted from the third light-emitting areas EA3 to the outside through the third light-transmitting areas TA3 may be blue light.

The light-transmitting layer TPL may include a base resin 230 and a light scatterer 231. The inclusion of the light scatterer 231 in the light-transmitting layer TPL may be optional.

The light-transmitting structure 200 may further include the reflective layer 220, which may cover (or overlap) parts of the surfaces of the transparent bank patterns 210 and parts of the surface of the light-transmitting members WCL1, WCL2, and TPL. The reflective layer 220 may include a metal, such as at least one of Ag, Mg, Al, Pt, Pd, Au, Ni, Nd, Ir, and Cr, and may be able to reflect light.

Figure 5:
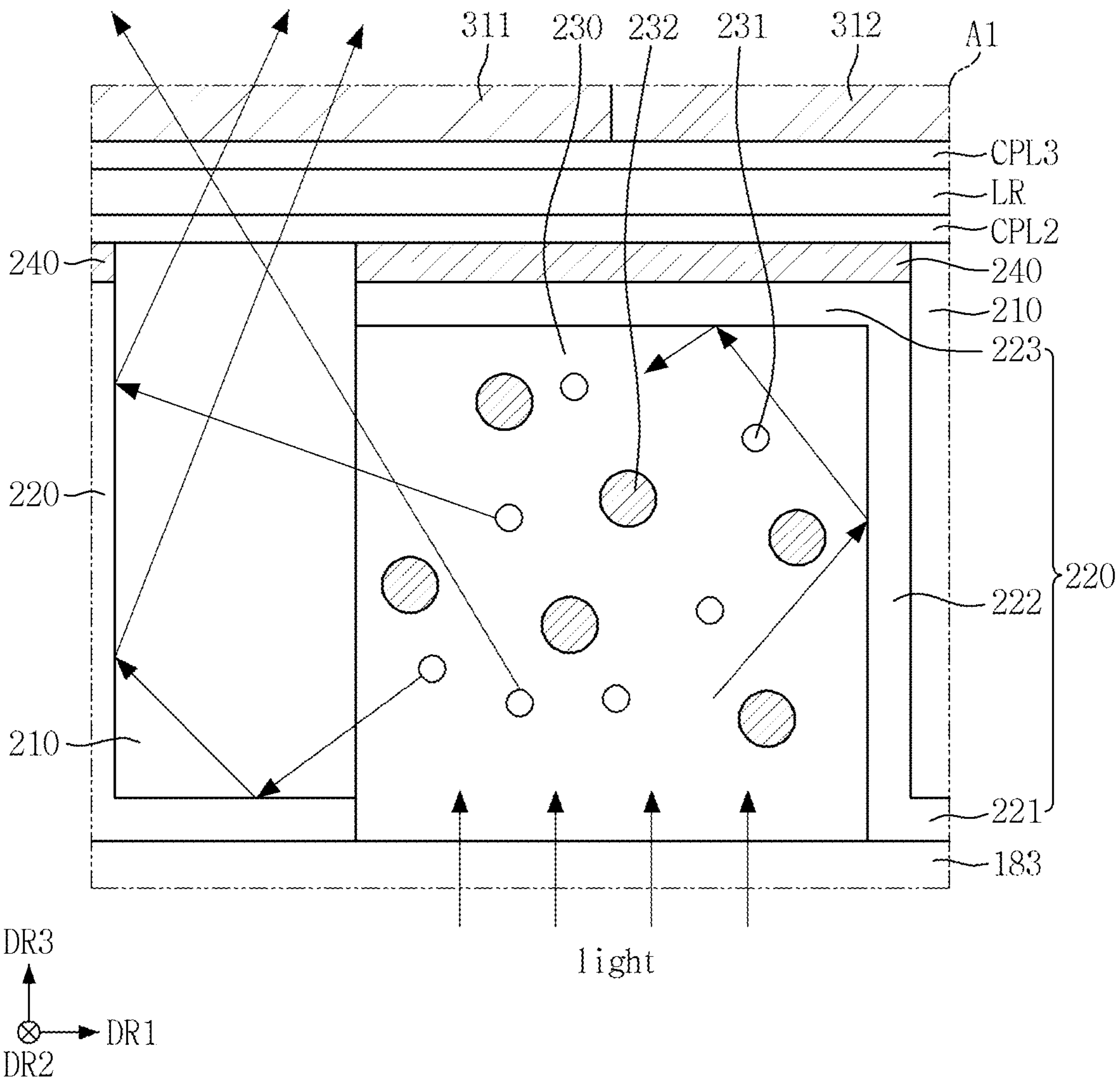
FIG. 5 is an enlarged schematic cross-sectional view of an area A1 of FIG. 4 according to an embodiment.

FIG. 5 is an enlarged schematic cross-sectional view of an area A1 of FIG. 4 according to an embodiment. For instance, FIG. 5 schematically illustrates a first light-transmitting area TA1 and a reflective layer 220 around a portion of the first light-transmitting area TA1 in a view in the second direction DR2. The light-transmitting areas TA1, TA2, and TA3 will, hereinafter, be described, taking the first light-transmitting areas TA1 as a representative light-transmitting area, and the following description of the first light-transmitting areas TA1 may also be applicable to the second light-transmitting areas TA2 and the third light-transmitting areas TA3.

Referring to FIG. 5, the reflective layer 220 may alter the path of the light emitted from the light-emitting elements in the light-emitting areas EA1, EA2, and EA3, directing the light toward the light-transmitting areas TA1, TA2, and TA3 overlapping the transparent bank patterns 210 in the third direction DR3. Even in instances that little or no overlap between the first light-transmitting areas TA1 and the first light-emitting areas EA1 is provided, light can be focused into the transparent bank patterns 210 and the first light-transmitting areas TA1 due to the reflective layer 220. Due, at least in part, to the presence of the reflective layer 220, the light scatterers 231 in the light-transmitting members WCL1, WCL2, and TPL may not be exposed to external light. The reflection of external light by the light scatterers 231 can be reduced, and the visibility of the display device 1 can be improved.

The reflective layer 220 may include first portions 221, which may be disposed between the transparent bank patterns 210 and the upper inorganic encapsulation layer 183, second portions 222, which may be disposed on first side (e.g., lateral side) surfaces of the transparent bank patterns 210, and third portions 223, which may be disposed on top surfaces of the light-transmitting members WCL1, WCL2, and TPL. The reflective layer 220 may surround (or cover) the top and side surfaces of each of the light-transmitting members WCL1, WCL2, and TPL, but may expose the first side surfaces of the light-transmitting members WCL1, WCL2, and TPL. The first side surfaces of the light-transmitting members WCL1, WCL2, and TPL may face second side (e.g., lateral side) surfaces of the transparent bank patterns 210 that are opposite to the first side surfaces of the transparent bank patterns 210 in, for instance, the first direction DR1. Light provided by the light-emitting elements and light whose wavelength is converted both proceed not toward the top of the light-transmitting members WCL1, WCL2, and TPL, but toward the exposed first side surfaces of the light-transmitting members WCL1, WCL2, and TPL by entering the transparent bank patterns 210. The light entering the transparent bank patterns 210 may be reflected by the reflective layer 220, which may be disposed on the bottom and the first side surfaces of each of the light-transmitting members WCL1, WCL2, and TPL, and may then be emitted out through the top surfaces of the transparent bank patterns 210.

The reflective layer 220 may not be disposed on the second side surfaces of the transparent bank patterns 210. The transparent bank patterns 210 may have the second side surfaces between the light-transmitting areas TA1, TA2, and TA3 and the corresponding light-emitting areas EA1, EA2, and EA3, and the first side surfaces between the light-transmitting areas TA1, TA2, and TA3 and the non-corresponding (or adjacent) light-emitting areas EA1, EA2, and EA3. The first light-transmitting area TA1 and the first light-emitting area EA1 may correspond to each other, the second light-transmitting area TA2 and the second light-emitting area EA2 may correspond to each other, and the third light-transmitting area TA3 and the third light-emitting area EA3 may correspond to each other.

The second portions 222 of the reflective layer 220 may be disposed on the second side surfaces of the light-transmitting members WCL1, WCL2, and TPL, and not on the first side surfaces of the light-transmitting members WCL1, WCL2, and TPL. The light-transmitting members WCL1, WCL2, and TPL may have first side surfaces between the light-transmitting areas TA1, TA2, and TA3 and the corresponding light-emitting areas EA1, EA2, and EA3, and second side surfaces between the light-transmitting areas TA1, TA2, and TA3 and the non-corresponding (or adjacent) light-emitting areas EA1, EA2, and EA3. The first side surfaces of the light-transmitting members WCL1, WCL2, and TPL may face the second side surfaces of the transparent bank patterns 210 that correspond to the light-transmitting areas TA1, TA2, and TA3, and the first side surfaces of the light-transmitting members WCL1, WCL2, and TPL may overlap the corresponding light-emitting areas EA1, EA2, and EA3 in the third direction DR3.

In some embodiments, the second portions 222 of the reflective layer 220 may also be disposed on side surfaces (e.g., third and fourth side surfaces) of the light-transmitting members WCL1, WCL2, and TPL that oppose one another in the second direction DR2. The second portions 222 of the reflective layer 220 that are disposed on the third and fourth side surfaces of the light-transmitting members WCL1, WCL2, and TPL may extend from regions of the second portions 222 of the reflective layer 220 that are disposed on the second side surfaces of the corresponding light-transmitting members WCL1, WCL2, and TPL. In a case that the light-transmitting members WCL1, WCL2, and TPL are formed as rectangular prisms, bottom surfaces and the first side surfaces of the rectangular prisms may not be covered by corresponding portions of the reflective layer 220, and remaining surfaces (e.g., the top surfaces, the second surfaces, the third surfaces, and the fourth surfaces) may be covered by corresponding portions of the reflective layer 220.

The first portions 221 of the reflective layer 220 may be disposed on the bottom surfaces of the transparent bank patterns 210. In some embodiments, the reflective layer 220 may cover the entire (or substantially entire) bottom surfaces of the transparent bank patterns 210.

The third portions 223 of the reflective layer 220 may be disposed between the light-transmitting members WCL1, WCL2, and TPL and the light-shielding layer 240. At least parts of the top surfaces of the light-transmitting members WCL1, WCL2, and TPL may be covered by the third portions 223 of the reflective layer 220. In an embodiment, the reflective layer 220 may cover the entire (or substantially entire) top surfaces of the light-transmitting members WCL1, WCL2, and TPL, but embodiments are not limited to this example. For instance, the reflective layer 220 may cover most of the top surfaces of the light-transmitting members WCL1, WCL2, and TPL, and may exposing edges of the top surfaces of the light-transmitting members WCL1, WCL2, and TPL.

The light-shielding layer 240 may be disposed on the reflective layer 220. The light-shielding layer 240 may define the light-shielding area BA of the light-transmitting structure 200 and may surround (or circumscribe) the light-transmitting areas TA1, TA2, and TA3 in a view in the third direction DR3.

At least parts of the top surfaces of the light-transmitting members WCL1, WCL2, and TPL may overlap the light-shielding layer 240 in the third direction DR3. In an embodiment, the light-shielding layer 240 may cover the entire (or substantially entire) top surfaces of the light-transmitting members WCL1, WCL2, and TPL, but embodiments are not limited to this example. For instance, the light-shielding layer 240 may cover most of the top surfaces of the light-transmitting members WCL1, WCL2, and TPL, and may expose edges of the top surfaces of the light-transmitting members WCL1, WCL2, and TPL.

The light-shielding layer 240 may include a light-absorbing material. For example, the light-shielding layer 240 may include at least one of an inorganic black pigment and an organic black pigment. The inorganic black pigment may be carbon black, and the organic black pigment may include at least one of lactam black, perylene black, and aniline black, but embodiments are not limited to these example materials. The light-shielding layer 240 can improve the color reproduction of the display device 1 by preventing visible light from infiltrating between the first light-transmitting areas TA1, the second light-transmitting areas TA2, and the third light-transmitting areas TA3 and that may otherwise cause color mixing.

The top surfaces of the light-shielding layer 240 and the top surfaces of the transparent bank patterns 210 may form a flat (or substantially flat) surface. In some implementations, the top surfaces of the light-shielding layer 240 and the top surfaces of the transparent bank patterns 210 may be coplanar with one another. The light-transmitting layer TPL, the first wavelength conversion layer WCL1, the second wavelength conversion layer WCL2, and the reflective layer 220 may be formed up to a height in the third direction DR3 that is lower than the top surfaces of the transparent bank patterns 210 relative to the substrate 110. Upper portions of the first side surfaces of the transparent bank patterns 210 may be exposed without being covered by the reflective layer 220, and upper portions of the second side surfaces of the transparent bank patterns 210 may be exposed without being covered by the light-transmitting members WCL1, WCL2, and TPL and the reflective layer 220. The exposed portions of the first side surfaces and second side surfaces of the transparent bank patterns 210 may be covered by the light-shielding layer 240.

Referring back to FIG. 4, the second capping layer CPL2 of the light-transmitting structure 200 may be disposed on the transparent bank patterns 210, the light-transmitting members WCL1, WCL2, and TPL, and the light-shielding layer 240 to prevent (or at least mitigate) impurities, such as moisture and/or air, from penetrating and damaging or contaminating the light-transmitting layer TPL, the first wavelength conversion layer WCL1, and/or the second wavelength conversion layer WCL2. The second capping layer CPL2 may contact the light-shielding layer 240 and the transparent bank patterns 210. The second capping layer CPL2 may have a continuous (or substantially continuous) film shape extending across the light-transmitting areas TA1, TA2, and TA3 and the light-shielding area BA.

The color filter structure 300 may have a structure including a low-refractive layer LR, a third capping layer CPL3, and the color filter layer 310 are sequentially stacked on the light-transmitting structure 200 in the recited order.

The low-refractive layer LR may be disposed on top of the second capping layer CPL2. As the low-refractive layer LR may have a lower refractive index than the transparent bank patterns 210, the low-refractive layer LR may induce total internal reflection of light proceeding from the transparent bank patterns 210 to the low-refractive layer LR, thereby recycling light. The low-refractive layer LR may planarize unevenness of an underlying surface.

The third capping layer CPL3 of the color filter structure 300 may be disposed on the low-refractive layer LR, covering or overlapping the low-refractive layer LR in the third direction DR3. The third capping layer CPL3 may prevent (or at least mitigate) impurities, such as moisture and/or air, from penetrating and damaging or contaminating the low-refractive layer LR and/or the color filter layer 310.

The third capping layer CPL3 may include an inorganic material. The third capping layer CPL3 may be formed as either a single layer or a multilayer structure.

The color filter layer 310 of the color filter structure 300 may be disposed on the third capping layer CPL3 and may include the first color filters 321, the second color filters 322, and the third color filters 323. Multiple color filters (hereinafter, collectively referred to as color filters 311, 312, and 313) may be disposed to respectively correspond to the light-transmitting areas TA1, TA2, and TA3.

The color filters 311, 312, and 313 may include a colorant, such as at least one of a dye and a pigment, that absorbs light of an entire (or substantially entire) wavelength range except for a particular (or selected) wavelength range, and may be disposed to respectively correspond to the colors of light emitted from the light-transmitting areas TA1, TA2, and TA3. For example, the first color filters 311 may overlap the first light-transmitting areas TA1 and may be red color filters that only allow red light to pass through. The second color filters 312 may overlap the second light-transmitting areas TA2 and may be green color filters that only allow green light to pass through. The third color filters 313 may overlap the third light-transmitting areas TA3 and may be blue color filters that only allow blue light to pass through.

Each of the light-transmitting areas TA1, TA2, and TA3 of the light-transmitting structure 200 may be covered by at least one of the color filters 311, 312, and 313. Each of the light-emitting areas EA1, EA2, and EA3 of the light-emitting structure 100 may respectively overlap two or more color filters in the third direction DR3. For example, the first light-emitting areas EA1 may respectively overlap both the first color filters 311 and the second color filters 312 in the third direction DR3, the second light-emitting areas EA2 may respectively overlap both the second color filters 312 and the third color filters 313 in the third direction DR3, and the third light-emitting areas EA3 may respectively overlap both the third color filters 313 and the first color filters 311 in the third direction DR3.

The color filters 311, 312, and 313 may form a flat surface without any (or without any substantial) step difference. For instance, the top surfaces of the color filters 311, 312, and 313 may form a flat surface, e.g., the top surfaces of the color filters 311, 312, and 313 may be coplanar with one another. The color filters 311, 312, and 313 may seamlessly cover the surface of the third capping layer CPL3 without any gaps (or with substantially no gaps). The presence of steps or gaps in the color filters 311, 312, and 313 may lead to reflection caused by external light.

An overcoat layer OC may be disposed on the color filters 311, 312, and 313 and may planarize the top of the color filters 311, 312, and 313. The overcoat layer OC may be a colorless, light-transmissive layer that does not exhibit a color in the visible spectrum. For example, the overcoat layer OC may include a colorless, light-transmitting organic material, such as an acrylic resin.

Figure 6:
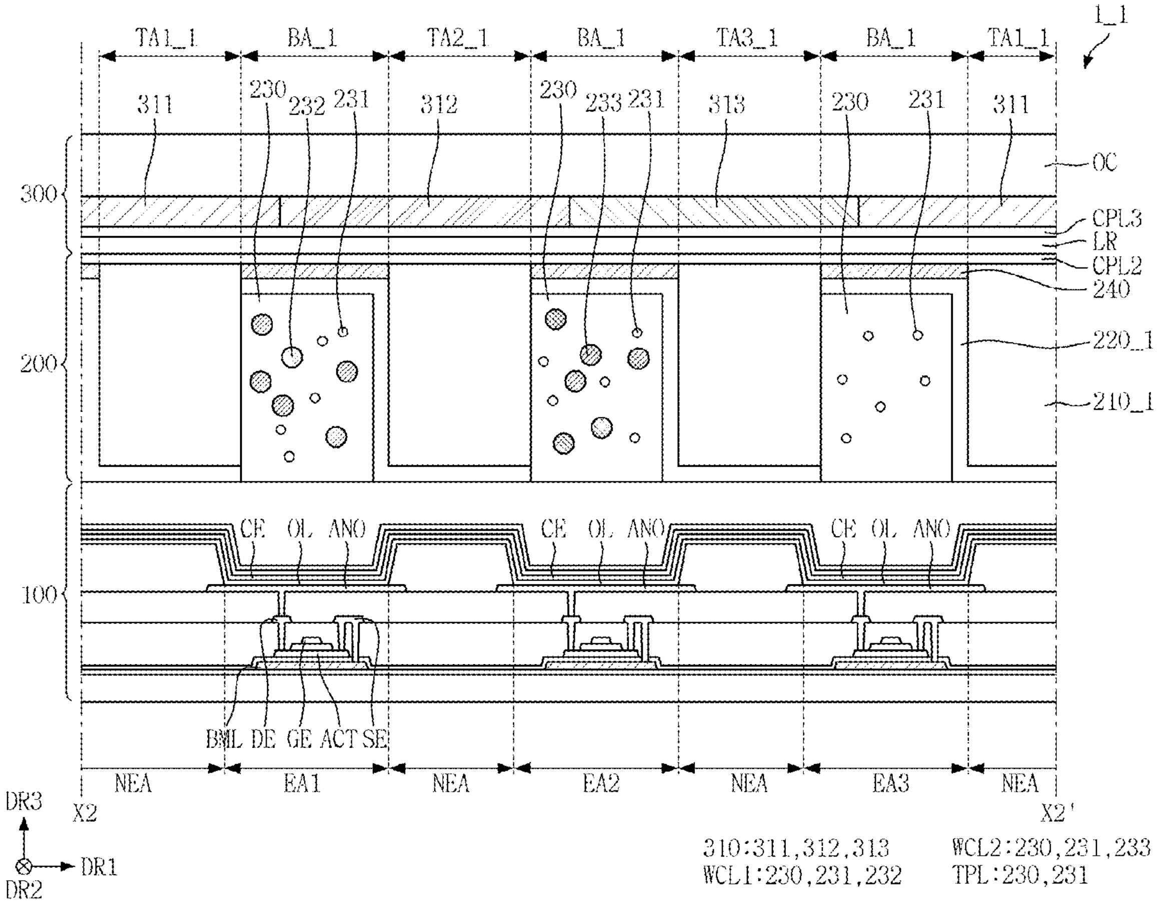
FIGS. 6 through 8 are cross-sectional views schematically illustrating display devices according to some embodiments.

FIG. 6 is a schematic cross-sectional view of a display device 1_1 according to an embodiment. Referring to FIG. 6, the display device 1_1 differs from the display device 1 described in association with FIG. 4 in the increased width of light-transmitting areas TA1_1, TA2_1, and TA3_1 in one or more of the first and second directions DR1 and DR2 and the decreased width of a light-shielding area BA_1 in one or more of the first and second directions DR1 and DR2. The width of transparent bank patterns 210_1 in one or more of the first and second directions DR1 and DR2 may also be increased. As the light-transmitting areas TA1_1, TA2_1, and TA3_1 expand in one or more of the first and second directions DR1 and DR2, the emission efficiency of the display device 1_1 may also change. The width of the transparent bank patterns 210_1 and the width of light-transmitting members WCL1, WCL2, and TPL in one or more of the first and second directions DR1 and DR2 may be adjusted to control emission efficiency of the display device 1_1.

Figure 7:
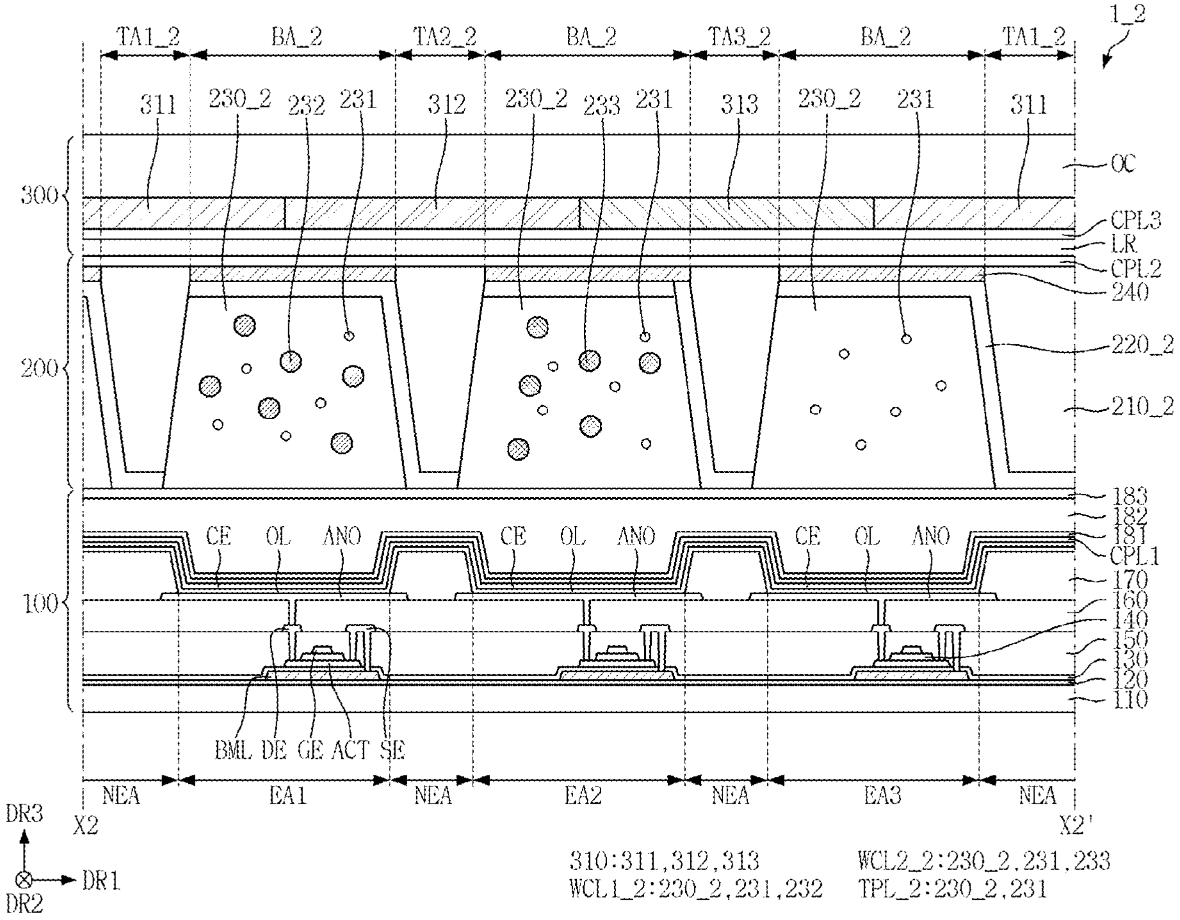

FIG. 7 is a schematic cross-sectional view of a display device 1_2 according to an embodiment. Referring to FIG. 7, the display device 1_2 differs from the display device 1 described in association with FIG. 4 in that transparent bank patterns 210_2 have a reverse-tapered cross-sectional shape in a plane parallel (or substantially parallel) to a DR1-DR3 plane, whereas the transparent bank patterns 210 described in association with FIG. 4 may have a rectangular cross-sectional shape in a plane parallel (or substantially parallel) to a DR1-DR3 plane. In some embodiments, the transparent bank patterns 210_2 may have inverted trapezoidal prism shapes such that first surfaces of the trapezoidal prism shapes that face the substrate 110 in the third direction DR3 have less surface area than second surfaces of the trapezoidal prism shapes that face the overcoat layer OC in the third direction DR3. In some implementations, the shape of the light-transmitting members WCL1_2, WCL2_2, and TPL_2 may be complementary to the shape of the transparent bank patterns 210_2. For instance, the light-transmitting members WCL1_2, WCL2_2, and TPL_2 may have non-inverted trapezoidal prism shapes complementary to the inverted trapezoidal prism shapes of the transparent bank patterns 210_2.

First side surfaces and second side surfaces of the transparent bank patterns 210_2 and first side surfaces and second side surfaces of light-transmitting members WCL1_2, WCL2_2, and TPL_2 may overlap light-transmitting areas TA1_2, TA2_2, and TA3_2 in the third direction DR3.

As the cross-sectional shape of the transparent bank patterns 210_2 is changed, a reflective layer 220_2 may be able to be disposed on the first side surfaces of the transparent bank patterns 210_2 to be inclined (or oblique to a plane parallel (or substantially parallel) to a DR1-DR2 plane), altering the path of emitted light. By modifying the cross-sectional shape of the transparent bank patterns 210_2, the path and/or emission efficiency of light can be controlled. Although FIG. 7 schematically illustrates a reverse-tapered cross-sectional shape for the transparent bank patterns 210_2, embodiments are not limited to this example. For instance, the transparent bank patterns 210_2 may have a regular-tapered cross-sectional shape in a plane parallel (or substantially parallel) to a DR1-DR3 plane. For instance, the transparent bank patterns 210_2 may have a non-inverted trapezoidal prism shape in which first surfaces of the trapezoidal prism shapes that face the substrate 110 in the third direction DR3 have a greater surface area than second surfaces of the trapezoidal prism shapes that face the overcoat layer OC in the third direction DR3. In a case in which the transparent bank patterns 210_2 have a non-inverted cross-sectional shape, the light-transmitting members WCL1_2, WCL2_2, and TPL_2 may have a complementary inverted cross-sectional shape.

Figure 8:
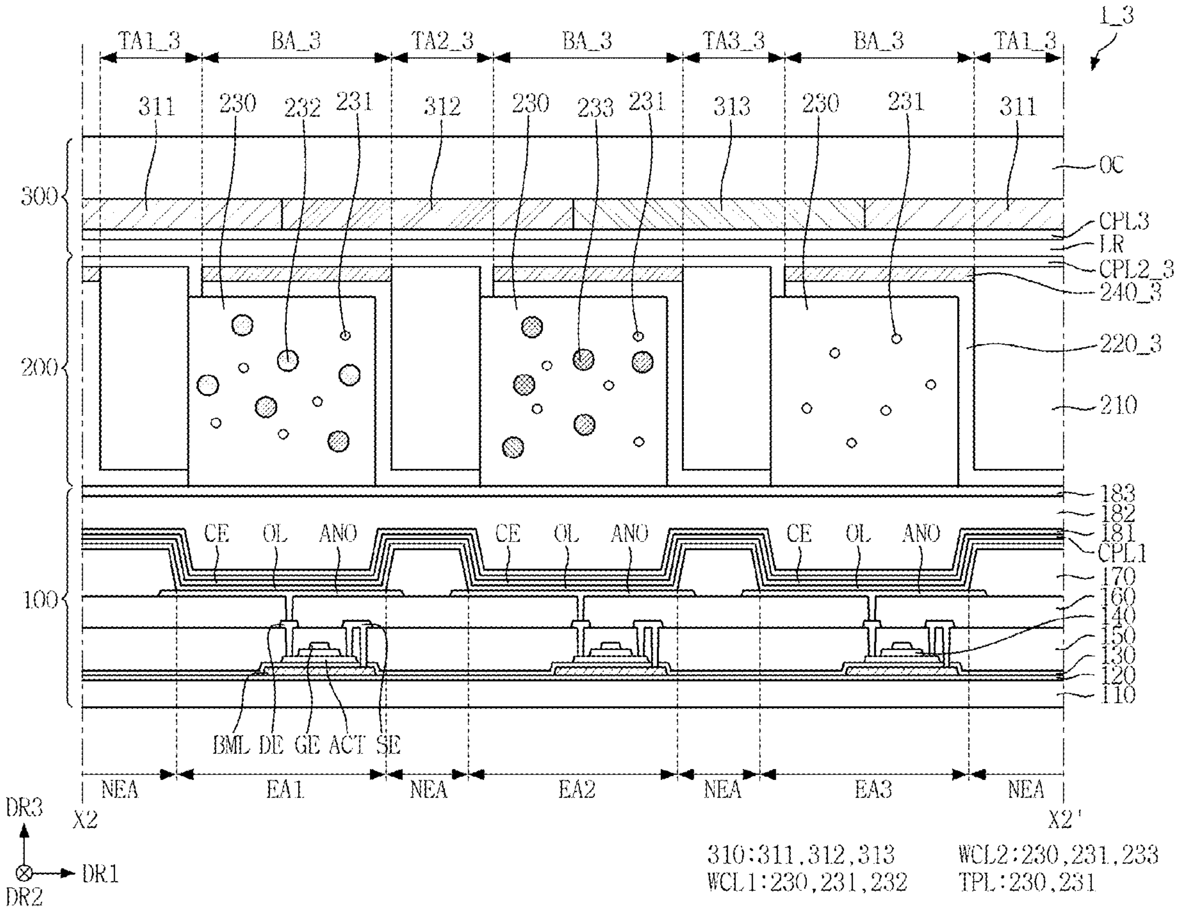

FIG. 8 is a schematic cross-sectional view of a display device 1_3 according to an embodiment. Referring to FIG. 8, the display device 1_3 differs from the display device 1 described in association with FIG. 4 in that a reflective layer 220_3 and a light-shielding layer 240_3 do not cover the entire top surfaces of light-transmitting members WCL1, WCL2, and TPL, but expose some of the edges of the light-transmitting members WCL1, WCL2, and TPL. The exposed parts of the top surfaces of the light-transmitting members WCL1, WCL2, and TPL may be covered by a second capping layer CPL2_3.

A method of fabricating the display device 1 will, hereinafter, be described.

FIGS. 9 through 14 are schematic cross-sectional views of the light-transmitting structure 200 and the color filter structure 300 of the display device 1 at various stages of manufacture according to an embodiment.

Figure 9:
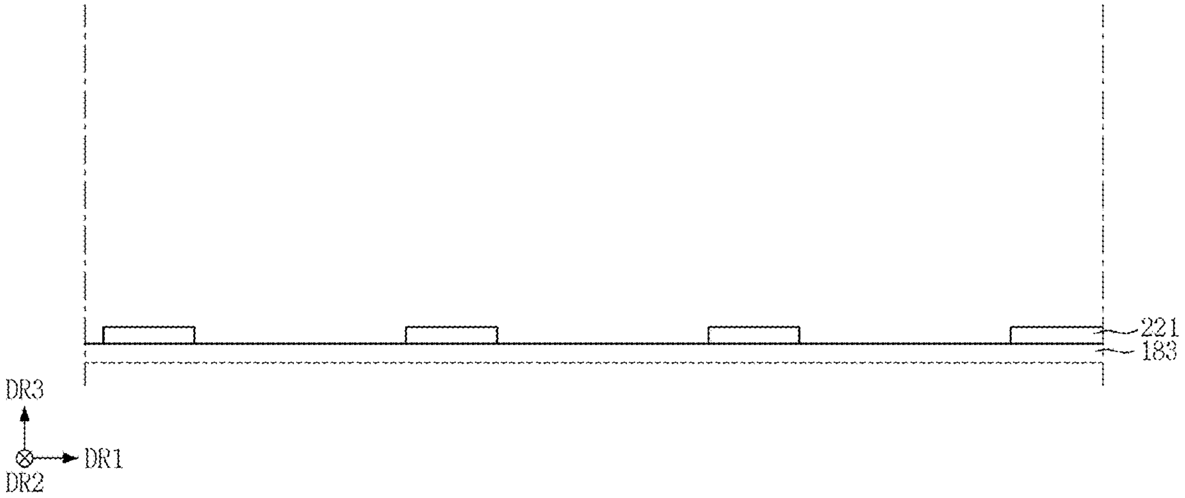
FIGS. 9 through 14 are schematic cross-sectional views of the light-transmitting structure and the color filter structure of the display device at various stages of manufacture according to an embodiment.

Referring to FIG. 9, the first portions 221 of the reflective layer 220 may be formed on the upper inorganic encapsulation layer 183 of the thin-film encapsulation layer 181, 182, and 183 of the display device 1. Multiple first portions 221 of the reflective layer 220 may be formed and may be spaced apart from one another in a view in, for instance, the third direction DR3.

Figure 10:
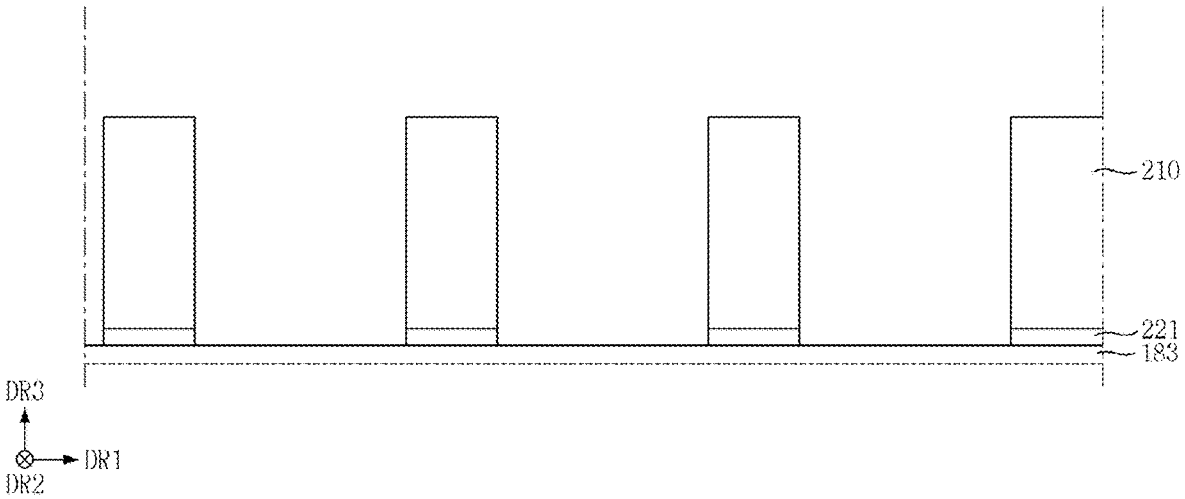

Referring to FIG. 10, the transparent bank patterns 210 may be formed on the first portions 221 of the reflective layer 220. Multiple transparent bank patterns 210 may be formed and may be spaced apart from one another in a view in, for instance, the third direction DR3. FIG. 10 schematically illustrates the transparent bank patterns 210 as being formed to cover the entire top surfaces of the first portions 221 of the reflective layer 220, but embodiments are not limited to this example. For instance, the transparent bank patterns 210 may be formed to expose at least one edge of the top surface of at least some of (e.g., each of) the first portions 221 of the reflective layer 220.

Figure 11:
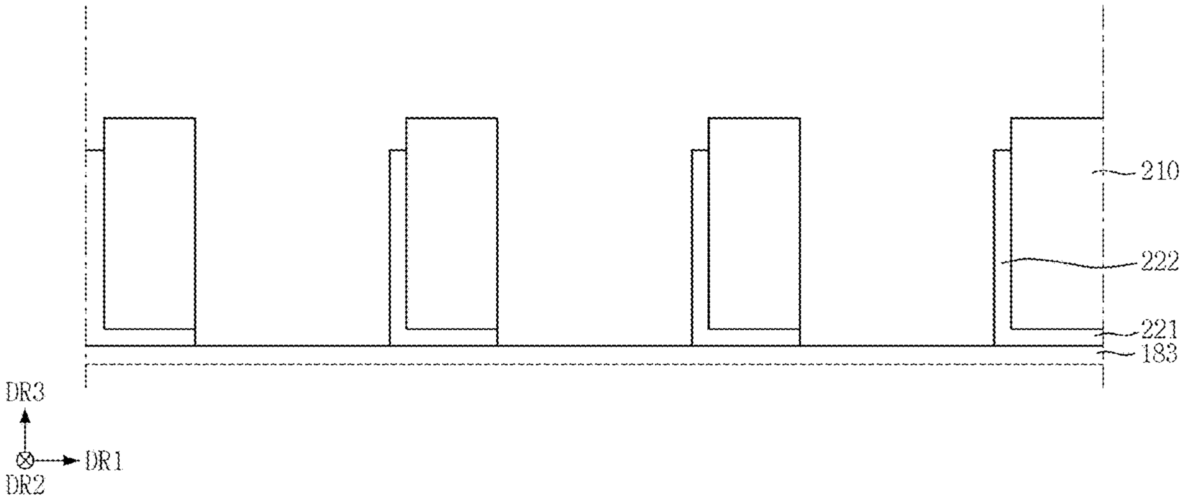

Referring to FIG. 11, the second portions 222 of the reflective layer 220 may be formed on the side surfaces of the transparent bank patterns 210 and may be physically connected to the first portions 221. The reflective layer 220 may be formed up to a height in the third direction DR3 lower than the top surfaces of the transparent bank patterns 210 relative to the upper inorganic encapsulation layer 183. Upper portions of the transparent bank patterns 210 may be exposed. The reflective layer 220 may be formed on one (or a) side surface of each of the transparent bank patterns 210.

Figure 12:
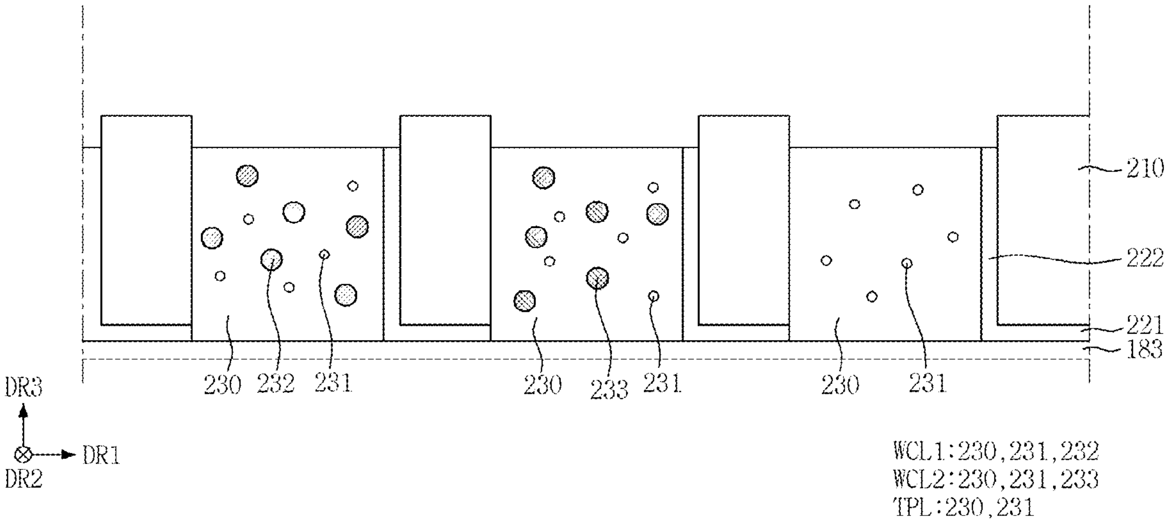

Referring to FIG. 12, the light-transmitting members WCL1, WCL2, and TPL may be formed in spaces between the transparent bank patterns 210. The first wavelength conversion layer WCL1 may be formed in the first light-emitting areas EA1, the second wavelength conversion layer WCL2 may be formed in the second light-emitting areas EA2, and the light-transmitting layer TPL may be formed in the third light-emitting areas EA3. In an embodiment, the light-transmitting members WCL1, WCL2, and TPL may be formed by an inkjet method using a nozzle. The light-transmitting layer TPL, the first wavelength conversion layer WCL1, and the second wavelength conversion layer WCL2 may be formed up to a height in the third direction DR3 lower than the top surfaces of the transparent bank patterns 210 relative to the upper inorganic encapsulation layer 183.

Figure 13:
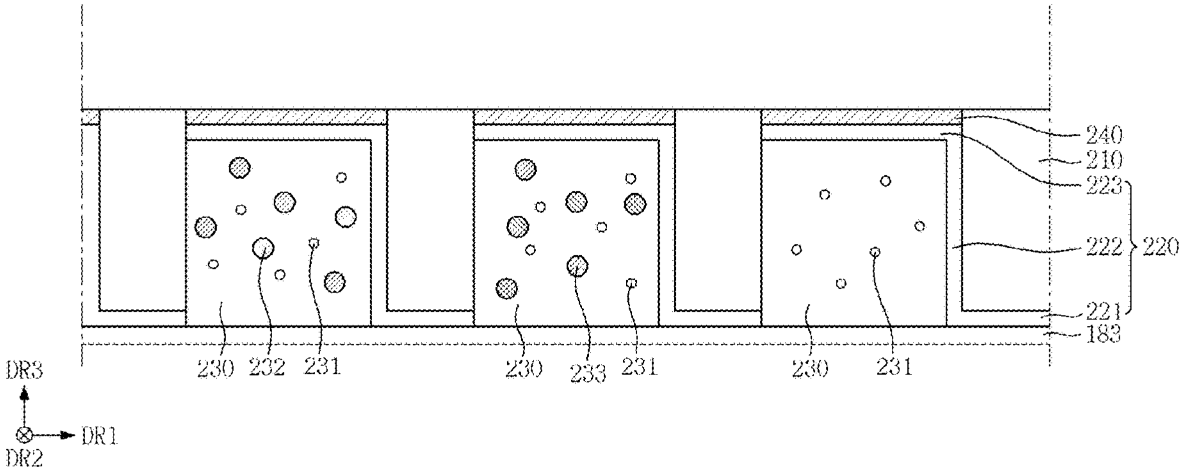

Referring to FIG. 13, the third portions 223 of the reflective layer 220 and the light-shielding layer 240 may be formed on the light-transmitting members WCL1, WCL2, and TPL. The third portions 223 of the reflective layer 220 may be physically connected to the second portions 222. FIG. 13 schematically illustrates the reflective layer 220 and the light-shielding layer 240 as covering the entire top surfaces of the light-transmitting members WCL1, WCL2, and TPL, but embodiments are not limited to this example. For instance, the reflective layer 220 and the light-shielding layer 240 may expose one (or an) edge of the top surface of some of (e.g., each of) the light-transmitting members WCL1, WCL2, and TPL. The light-shielding layer 240 may be formed up to the height in the third direction DR3 of the top surfaces of the transparent bank patterns 210 relative to the upper inorganic encapsulation layer 183. The top surface of the light-shielding layer 240 may form a flat (or planar) surface with the top surfaces of the transparent bank patterns 210.

Figure 14:
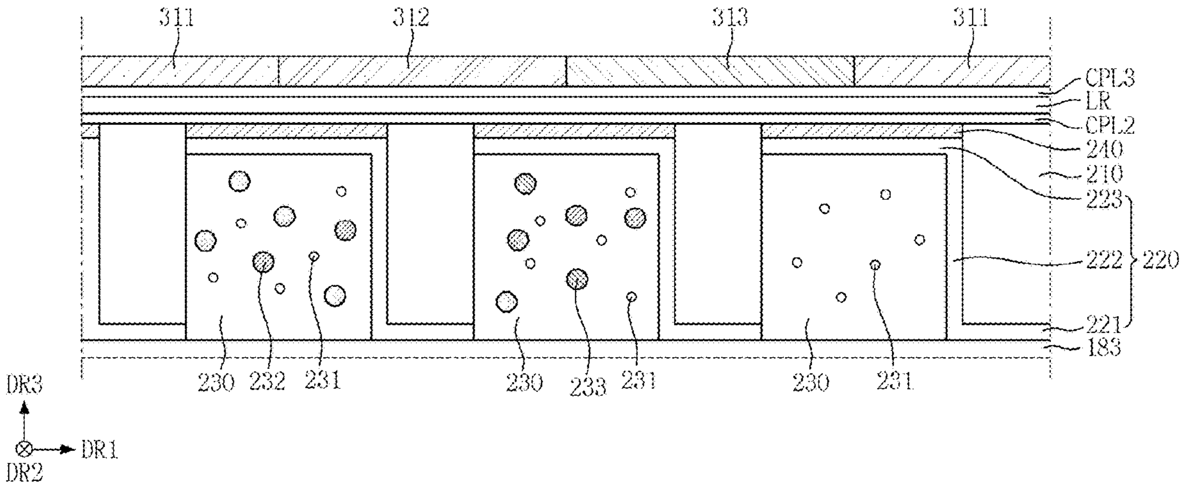

Referring to FIG. 14, the second capping layer CPL2, the low-refractive layer LR, and the third capping layer CPL3 may be sequentially formed on the light-shielding layer 240 and the transparent bank patterns 210, and the color filters 311, 312, and 313 may be formed on the third capping layer CPL3.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatuses of the disclosed embodiments. Accordingly, embodiments are to be considered illustrative and not as restrictive, and embodiments are not to be limited to the details given herein.

What is claimed is:

1. A display device comprising:

a substrate;

a first light-emitting element disposed on the substrate;

a second light-emitting element disposed on the substrate and spaced apart from the first light-emitting element;

a pixel-defining layer disposed on the substrate and at least partially bounding areas corresponding to the first light-emitting element and the second light-emitting element;

a first wavelength conversion layer disposed on the first light-emitting element;

a second wavelength conversion layer disposed on the second light-emitting element;

a first transparent bank pattern disposed on the pixel-defining layer, the first transparent bank pattern being disposed between the first wavelength conversion layer and the second wavelength conversion layer; and a reflective layer disposed on each of a first lateral side surface of the first transparent bank pattern, a bottom surface of the first transparent bank pattern that faces the substrate, and a top surface of the first wavelength conversion layer that opposes the substrate.

2. The display device of claim 1, wherein the first lateral side surface of the first transparent bank pattern faces a corresponding first lateral side surface of the first wavelength conversion layer, and a second lateral side surface of the first transparent bank pattern opposes the first lateral side surface of the first transparent bank pattern and faces a corresponding second lateral side surface of the second wavelength conversion layer.

3. The display device of claim 2, wherein the second lateral side surface of the first transparent bank pattern directly contacts the corresponding second lateral side surface of the second wavelength conversion layer.

4. The display device of claim 1, further comprising:

a light-shielding layer disposed on the reflective layer.

5. The display device of claim 4, wherein the light-shielding layer overlaps each of the first light-emitting element, the second light-emitting element, the first wavelength conversion layer, and the second wavelength conversion layer.

6. The display device of claim 5, wherein a top surface of the light-shielding layer and a top surface of the first transparent bank pattern are coplanar with one another.

7. The display device of claim 1, further comprising:

a second transparent bank pattern disposed on the pixel-defining layer and spaced apart from the first transparent bank pattern, the first wavelength conversion layer being disposed between the second transparent bank pattern and the first transparent bank pattern;

a first color filter disposed on the second transparent bank pattern and the first wavelength conversion layer; and a second color filter disposed on each of the first transparent bank pattern, the first wavelength conversion layer, and the second wavelength conversion layer.

8. The display device of claim 7, wherein the first light-emitting element overlaps both the first color filter and the second color filter.

9. The display device of claim 7, wherein the first color filter overlaps an entire top surface of the first transparent bank pattern, and the second color filter overlaps an entire top surface of the second transparent bank pattern.

10. The display device of claim 1, wherein, in a plane perpendicular to the substrate, the first transparent bank pattern has a rectangular cross-sectional shape or a cross-sectional shape in which the first lateral side extends oblique to the substrate.

11. The display device of claim 1, further comprising:

a third light-emitting element disposed on the substrate and spaced apart from both the first light-emitting element and the second light-emitting element; and a light-transmitting layer disposed on the third light-emitting element.

12. The display device of claim 11, wherein the first wavelength conversion layer includes a base resin and a first wavelength conversion shifter, the second wavelength conversion layer includes a base resin and a second wavelength conversion shifter different from the first wavelength conversion shifter, and the light-transmitting layer includes a base resin.

13. A display device comprising:

a light-emitting structure including a first light-emitting area, a second light-emitting area, and a non-light-emitting area around the first light-emitting area and the second light-emitting area in a view in a direction perpendicular to the light-emitting structure;

a light-transmitting structure disposed on the light-emitting structure, the light-transmitting structure including a first light-transmitting area, a second light-transmitting area, and a light-shielding area around the first light-transmitting area and the second light-transmitting area in the view; and a color filter structure disposed on the light-transmitting structure, wherein the light-shielding area respectively overlaps the first light-emitting area and the second light-emitting area in the view, and both the first light-transmitting area and the second light-transmitting area overlap the non-light-emitting area in the view.

14. The display device of claim 13, wherein the display device is structured so that light emitted from the first light-emitting area passes through the first light-transmitting area, and light emitted from the second light-emitting area passes through the second light-transmitting area.

15. The display device of claim 13, wherein the color filter structure includes:

a first color filter respectively overlapping the first light-transmitting area and a first portion of the non-light-emitting area in the view; and a second color filter respectively overlapping the second light-transmitting area and a second portion of the non-light-emitting area.

16. The display device of claim 15, wherein both the first color filter and the second color filter overlap the first light-emitting area in the view.

17. The display device of claim 13, wherein the light-transmitting structure includes:

transparent bank patterns disposed in the first light-transmitting area and the second light-transmitting area;

light-transmitting members disposed in spaces between the transparent bank patterns and that overlap the light-shielding area in the view; and a reflective layer disposed on each of bottom surfaces of the transparent bank patterns that face the light-emitting structure, first lateral side surfaces of the transparent bank patterns, and top surfaces of the light-transmitting members that face away from the light-emitting structure.

18. The display device of claim 17, wherein the transparent bank patterns include second lateral side surfaces that are different from the first lateral side surfaces, and the second lateral side surfaces of the transparent bank patterns directly contact corresponding light-transmitting members among the light-transmitting members.

19. A method of fabricating a display device, the method comprising:

forming first portions of a reflective layer on a light-emitting structure that includes light-emitting elements;

forming transparent bank patterns on the first portions of the reflective layer; and forming second portions of the reflective layer on first lateral side surfaces of the transparent bank patterns such that the second portions of the reflective layer are respectively connected to the first portions of the reflective layer.

20. The method of claim 19, further comprising:

forming light-transmitting members on the light-emitting structure and between respectively adjacent transparent bank patterns among the transparent bank patterns; and forming third portions of the reflective layer on the light-transmitting members such that the third portions of the reflective layer are respectively connected to the second portions of the reflective layer.

21. An electronic device comprising:

a display device comprising a substrate;

a first light-emitting element disposed on the substrate;

a second light-emitting element disposed on the substrate and spaced apart from the first light-emitting element;

a pixel-defining layer disposed on the substrate and at least partially bounding areas corresponding to the first light-emitting element and the second light-emitting element;

a first wavelength conversion layer disposed on the first light-emitting element;

a second wavelength conversion layer disposed on the second light-emitting element;

a first transparent bank pattern disposed on the pixel-defining layer, the first transparent bank pattern being disposed between the first wavelength conversion layer and the second wavelength conversion layer; and a reflective layer disposed on each of a first lateral side surface of the first transparent bank pattern, a bottom surface of the first transparent bank pattern that faces the substrate, and a top surface of the first wavelength conversion layer that opposes the substrate.

* * * * *